US011945723B2

(12) United States Patent
Gohda et al.

(10) Patent No.: US 11,945,723 B2
(45) Date of Patent: Apr. 2, 2024

(54) METHOD FOR PRODUCING CARBON MATERIAL COMPLEX

(71) Applicant: NIPPON SHOKUBAI CO., LTD., Osaka (JP)

(72) Inventors: Syun Gohda, Osaka (JP); Tatsuya Yamaguchi, Hyogo (JP); Hironobu Ono, Osaka (JP); Osamu Konosu, Osaka (JP)

(73) Assignee: Nippon Shokubai Co., Ltd., Osaka (JP)

( * ) Notice: Subject to any disclaimer, the term of this patent is extended or adjusted under 35 U.S.C. 154(b) by 763 days.

(21) Appl. No.: 17/049,863

(22) PCT Filed: Apr. 24, 2019

(86) PCT No.: PCT/JP2019/017444
§ 371 (c)(1),
(2) Date: Oct. 22, 2020

(87) PCT Pub. No.: WO2019/208636
PCT Pub. Date: Oct. 31, 2019

(65) Prior Publication Data
US 2021/0238041 A1 Aug. 5, 2021

(30) Foreign Application Priority Data

| Apr. 27, 2018 | (JP) | 2018-086822 |
| Apr. 27, 2018 | (JP) | 2018-086823 |
| Jun. 28, 2018 | (JP) | 2018-123224 |
| Oct. 19, 2018 | (JP) | 2018-197835 |

(51) Int. Cl.
C01B 32/198 (2017.01)
C01B 32/23 (2017.01)
C08K 3/04 (2006.01)
C08L 33/10 (2006.01)
C08L 63/00 (2006.01)

(52) U.S. Cl.
CPC ............ *C01B 32/198* (2017.08); *C01B 32/23* (2017.08); *C08K 3/042* (2017.05); *C08L 33/10* (2013.01); *C08L 63/00* (2013.01)

(58) Field of Classification Search
CPC ........ C01B 32/198; C01B 32/23; C08K 3/042
See application file for complete search history.

(56) References Cited

U.S. PATENT DOCUMENTS

| 2009/0022649 A1 | 1/2009 | Zhamu et al. |
| 2010/0044646 A1 | 2/2010 | Zhamu et al. |
| 2010/0055458 A1 | 3/2010 | Jang et al. |
| 2010/0056819 A1 | 3/2010 | Jang et al. |
| 2011/0268647 A1 | 11/2011 | Ivanovichi et al. |
| 2012/0315482 A1 | 12/2012 | Muramatsu et al. |
| 2013/0015409 A1 | 1/2013 | Fugetsu |
| 2013/0171355 A1 | 7/2013 | Wang et al. |
| 2014/0170412 A1 | 6/2014 | Ji et al. |
| 2014/0370274 A1 | 12/2014 | Lee |
| 2015/0099180 A1 | 4/2015 | Cericola et al. |
| 2017/0054149 A1 | 2/2017 | Wang et al. |
| 2018/0254119 A1 | 9/2018 | Cericola et al. |
| 2018/0319668 A1 | 11/2018 | Ono et al. |
| 2018/0327269 A1 | 11/2018 | Gohda et al. |

FOREIGN PATENT DOCUMENTS

| DE | 10 2012 216 828 | 3/2014 |
| JP | 2012-153590 | 8/2012 |
| JP | 2013-139371 | 7/2013 |
| JP | 2014-118563 | 6/2014 |
| JP | 2014-529319 | 11/2014 |
| JP | 2015-525184 | 9/2015 |
| JP | 2017-088451 | 5/2017 |
| JP | 2017-171523 | 9/2017 |
| JP | 2017-178770 | 10/2017 |
| JP | 2017-218373 | * 12/2017 |
| WO | 2011/074125 | 6/2011 |
| WO | 2011/102473 | 8/2011 |
| WO | 2013/010211 | 1/2013 |
| WO | 2017/082263 | 5/2017 |

OTHER PUBLICATIONS

Database WPI Week 201801, Thomson Scientific, London, GB, AN 2017-85033W, 2017, XP002805219, 2 pages.
Hummers, et al., "Preparation of Graphitic Oxide", J. Am. Chem. Soc., 1958, 80, p. 1339.
Dua, et al., "All-Organic Vapor Sensor Using Inject-Printed Reduced Graphene Oxide", Angew. Chem. Int. Ed, 2010, 49, pp. 1-5.
Gao, et al., "Accordion-like graphene by a facile and green synthesis method reinforcing polyolefin nanocomposites", RSC Adv., 2017, 7, pp. 31085-31092.
Wang, et al., "Amphoteric surfactant promoted three-dimensional assembly of graphene micro/nanoclusters to accomodate Pt nanoparticles for methanol oxidation", Electrochimica Acta 160, 2015, pp. 288-295.

* cited by examiner

*Primary Examiner* — Carlos A Azpuru
(74) *Attorney, Agent, or Firm* — HSML, P.C.

(57) ABSTRACT

Provided is a method of simply producing high-quality graphite oxide. The present invention relates to a method of producing a carbon material composite containing graphite oxide and at least one surfactant selected from the group consisting of a nonionic surfactant, a cationic surfactant, and an amphoteric surfactant, the method including: oxidizing graphite; mixing an aqueous dispersion obtained through the oxidizing, the aqueous dispersion containing graphite oxide dispersed therein, and the at least one surfactant selected from the group consisting of a nonionic surfactant, a cationic surfactant, and an amphoteric surfactant; and purifying the carbon material composite.

5 Claims, No Drawings

METHOD FOR PRODUCING CARBON MATERIAL COMPLEX

TECHNICAL FIELD

The present invention relates to a method of producing a carbon material composite. Specifically, the present invention relates to a method of producing a carbon material composite that is suitable for catalysts, electrode active materials for cells and capacitors, thermoelectric conversion materials, conductive materials, light-emitting materials, additives for lubricants, additives for polymers (resin), permeable membrane materials, antimicrobial materials, water-repellent materials, and adsorption materials.

BACKGROUND ART

Carbon materials have good properties such as hardness, and are used in various fields such as semiconductors, cells, automobiles, information and communications, and industrial equipment.

Graphite oxide, a type of carbon material, provided with an oxygen-containing functional group is prepared by oxidizing graphite, which has a layered structure in which carbon atoms are bonded to each other through $sp^2$ bonding and arranged in planes. Many studies have been conducted on graphite oxide for its unique structure and properties.

Graphite oxide is expected to be used for various applications such as catalysts, electrode active materials for cells and capacitors, thermoelectric conversion materials, conductive materials, light-emitting materials, additives for lubricants, additives for polymers, permeable membrane materials, antimicrobial materials, water-repellent materials, and adsorption materials.

A known usual method of producing graphite oxide is a method in which graphite oxide is synthesized by reacting graphite with a strong oxidant in an acid solvent. Non-Patent Literature 1 discloses the Hummers method in which sulfuric acid and potassium permanganate are used as oxidants. Other known methods of producing graphite oxide include, for example, the Brodie method in which nitric acid and potassium chlorate are used and the Staudenmaier method in which sulfuric acid, nitric acid, and potassium chlorate are used as oxidants.

For example, Patent Literature 1 discloses a method of producing a graphite oxide derivative including: between oxidation of graphite and preparation of a graphite oxide derivative, adding a solvent having a solubility in water of 0.01% or higher and not arbitrarily miscible with water to a reaction solution containing graphite oxide obtained through the oxidation; and then separating a graphite oxide-containing composition.

Patent Literature 2 discloses an aggregate of a composite including purified graphene oxide (graphite oxide) and cationic lipid. Non-Patent Literature 2 discloses that to prepare a graphite oxide dispersion in which graphite oxide is well dispersed, purified and dried graphite oxide powder is dispersed in deionized water to prepare a dispersion, a low-molecular-weight polyethylene glycol is added to the dispersion, and the dispersion is subjected to ultrasonication. Further, Non-Patent Literature 3 discloses that graphene oxide (graphite oxide) is modified with a specific amine oxide. Non-Patent Literature 4 discloses that an aqueous solution of a specific betaine is added to a suspension of graphene oxide.

CITATION LIST

Patent Literature

Patent Literature 1: WO 2017/082263
Patent Literature 2: JP 2012-153590 A

Non-Patent Literature

Non-Patent Literature 1: William S. Hummers, et al., J. Am. Chem. Soc., 1958, 80, 1339.
Non-Patent Literature 2: Vineet Dua, et al., Angew. Chem. Int. Ed. 2010, 49, 1-5
Non-Patent Literature 3: Wensheng Gao, et al., RSC Adv. 2017, 7, 31085-31092
Non-Patent Literature 4: Zonghua Wang, et al., Electrochimica Acta 160 (2015) 288-295

SUMMARY OF INVENTION

Technical Problem

As described above, there are various known methods of producing graphite oxide, which is a type of carbon material. A common method of producing graphite oxide includes preparing graphite oxide through oxidation and then purifying the graphite oxide from the reaction solution usually by repetition of centrifugation or filtration of the reaction solution. However, the former treatment causes complication of the process and an increase in liquid waste, and the latter treatment tends to cause clogging of a filter. The purifying in either case takes time, leading to an increase in cost. Thus, the method of producing graphite oxide has room for improvement in terms of efficient production. Particularly in Patent Literature 2, a composite is presupposed to be obtained by allowing a cationic lipid to act on purified graphite oxide. Thus, purification is necessary to prepare the composite, leading to an increase in cost in industrial implementation. On the other hand, the method described in Patent Literature 1 enables efficient separation of graphite oxide by liquid-liquid separation of a water phase and an organic phase, and can simply produce high-quality graphite oxide. In industrial production of graphite oxide, more efficient separation of graphite oxide, particularly filtration, has still been strongly desired for more simple production of high-quality graphite oxide.

The present invention has been made in view of the state of the art, and aims to provide a method of simply producing high-quality graphite oxide.

Solution to Problem

The present inventors have conducted various studies on methods of more simply producing high-quality graphite oxide and found, with respect to purification of graphite oxide from an aqueous dispersion obtained through oxidation, the aqueous dispersion containing graphite oxide dispersed therein, a method including: mixing the aqueous dispersion and at least one surfactant selected from the group consisting of a nonionic surfactant, a cationic surfactant, and an amphoteric surfactant; and purifying a carbon material composite containing the graphite oxide and the at least one surfactant selected from the group consisting of a nonionic surfactant, a cationic surfactant, and an amphoteric surfactant. According to the method, the carbon material composite aggregates by the action of the at least one surfactant even in the presence of residual acids in the aqueous dispersion to produce less dispersible large aggregates. Such aggregates are less likely to cause clogging of the filter when the aqueous dispersion is filtered, for example. Thereby, the duration of the purifying can be greatly reduced and acids can be sufficiently removed. Thus, the carbon material composite can be purified very efficiently. The reason for this is considered as follows according to the latest knowledge of the present inventors.

First, the action that the carbon material composite aggregates by the action of a nonionic surfactant even in the presence of residual acids is described. Graphite oxide undergoes ionization of an acid group and is weakly acidic in water, while it does not undergo ionization of an acid group and is neutral in the presence of a strong acid such as sulfuric acid. When the aqueous dispersion obtained through oxidation, the aqueous dispersion containing graphite oxide dispersed therein, is mixed with a nonionic surfactant, the graphite oxide hydrophobically interacts with the nonionic surfactant so that they aggregate together as a carbon material composite containing the nonionic surfactant and the graphite oxide. Owing to the nonionic surfactant, which has a weak aggregating force, the carbon material composite does not aggregate very strongly. Thus, water can enter the aggregates and wash away the sulfuric acid. Further, the carbon material composite not so strongly aggregating easily disaggregates through exfoliation, and can be redispersed in a dispersion medium. Hereinafter, an aspect relating to the carbon material composite containing a nonionic surfactant and graphite oxide is also referred to as a first aspect of the present invention.

Next, the action that the carbon material composite aggregates by the action of a cationic surfactant even in the presence of residual acids is described. When the aqueous dispersion obtained through oxidation, the aqueous dispersion containing graphite oxide dispersed therein, is mixed with a cationic surfactant, the graphite oxide and the cationic surfactant interact with each other, specifically, a cation-exchange reaction of the graphite oxide occurs. Thereby, the graphite oxide is hydrophobized to aggregate as a carbon material composite containing the cationic surfactant and the graphite oxide. As a result, the carbon material composite can be easily separated from water-soluble impurities such as acids and salts. The cation-exchange reaction is found to occur effectively even in the system containing strong acids such as sulfuric acid. In other words, unlike the invention described in Patent Literature 2, impurities can be simply removed by mixing the aqueous dispersion (reaction solution) after the oxidation with a cationic surfactant. Hereinafter, an aspect relating to the carbon material composite containing a cationic surfactant and graphite oxide, and optionally a different surfactant is also referred to as a second aspect of the present invention.

Furthermore, the action that the carbon material composite aggregates by the action of an amphoteric surfactant even in the presence of residual acids is described. When the aqueous dispersion obtained through oxidation, the aqueous dispersion containing graphite oxide dispersed therein, is mixed with an amphoteric surfactant, the graphite oxide interacts with the amphoteric surfactant so that they aggregate together as a carbon material composite containing the amphoteric surfactant and the graphite oxide. Such a carbon material composite can be easily separated from water-soluble impurities such as acids and salts. In other words, impurities can be simply removed by mixing the aqueous dispersion (reaction solution) after the oxidation with an amphoteric surfactant. Hereinafter, an aspect relating to the carbon material composite containing an amphoteric surfactant and graphite oxide, and optionally a different surfactant is also referred to as a third aspect of the present invention.

The present inventors found that the production method can simply produce a high-quality carbon material composite at low cost and that the method markedly achieves such effects particularly when it is applied to industrial production of carbon material composites. Thus, they arrived at an admirable solution to the problem, completing the present invention.

The present inventors also found that each carbon material composite obtained through the oxidation, the mixing, and the purification can be suitably exfoliated into layers in a dispersion medium.

For example, the present inventors found that the carbon material composite obtained through mixing of a cationic surfactant can be suitably exfoliated into layers in an organic dispersion medium. The reason for this is considered as follows. Surfaces of the graphite oxide modified with a cationic surfactant become hydrophobic and highly interact with an organic dispersion medium having hydrophobic sites. Thus, the carbon material composite containing the cationic surfactant and the graphite oxide can be dispersed in an organic dispersion medium, and the graphite oxide can be exfoliated into layers.

The present inventors also found a method including: mixing a cationic surfactant, a nonionic surfactant, and an aqueous dispersion obtained through oxidation, the aqueous dispersion containing graphite oxide dispersed therein; and purifying a carbon material composite containing the nonionic surfactant, the cationic surfactant, and the graphite oxide. According to the method, the carbon material composite aggregates by the action of the nonionic surfactant and the cationic surfactant even in the presence of residual acids in the aqueous dispersion to produce less dispersible large aggregates. Such aggregates are less likely to cause clogging of the filter when the aqueous dispersion is filtered, for example. Thereby, the duration of purifying can be greatly reduced and acids can be sufficiently removed. Thus, the carbon material composite can be purified very efficiently. The present inventors also found that with addition of a cationic surfactant as a single surfactant, the graphite oxide is highly hydrophobic and is suitably exfoliated into layers in an organic dispersion medium, while with simultaneous addition of a cationic surfactant and a nonionic surfactant, the hydrophobicity can be controlled, and the graphite oxide is particularly suitably exfoliated into layers in a highly polar dispersion medium such as water. The reason for this is considered as follows. The nonionic surfactant, which has a weak aggregating force, does not aggregate the carbon material composite so strongly, and the carbon material composite easily disaggregates through exfoliation even in a highly polar dispersion medium and can be redispersed in a dispersion medium. In other words, the use of a nonionic surfactant in combination with a cationic surfactant enables the control of the dispersibility. The present inventors also found that a cationic surfactant having a highly polar hydrophilic group (a cationizable group) such as a quaternary ammonium salt group and a relatively poorly polar hydrophilic group such as a polyoxyalkylene group enables control of the degrees of hydrophilicity and polarity. Thus, the present inventors found that the use of the cationic surfactant as a single surfactant can achieve the same effects as those achieved by the use of a cationic surfactant and a nonionic surfactant in combination.

The present inventors also found that the carbon material composite obtained through mixing of an amphoteric surfactant can be suitably exfoliated into layers in a specific organic dispersion medium. The reason for this is considered as follows. When surfaces of the graphite oxide are modified with amphoteric surfactants, hydrophobic groups and anionizable groups are directed to a surface side of the graphite oxide as described later. The graphite oxide highly interacts with a relatively highly polar organic dispersion medium. Thus, the carbon material composite containing the amphoteric surfactant and the graphite oxide can be dispersed in the organic dispersion medium, and the graphite oxide can be exfoliated into layers.

The present inventors found that such a method can simply produce a high-quality carbon material composite at low cost.

The present inventors also found a method including: mixing an amphoteric surfactant, a nonionic surfactant, and an aqueous dispersion obtained through oxidation, the aqueous dispersion containing graphite oxide dispersed therein; and purifying a carbon material composite containing the nonionic surfactant, the amphoteric surfactant, and the graphite oxide. According to the method, the carbon material composite aggregates by the action of the nonionic surfactant and the amphoteric surfactant even in the presence of residual acids in the aqueous dispersion to produce less dispersible large aggregates. Such aggregates are less likely to cause clogging of the filter when the aqueous dispersion is filtered, for example. Thereby, the duration of purifying can be greatly reduced and acids can be sufficiently removed. Thus, the carbon material composite can be purified very efficiently. The present inventors also found that with addition of an amphoteric surfactant as a single surfactant, the graphite oxide is suitably exfoliated particularly in a relatively highly polar organic solvent, while with simultaneous addition of an amphoteric surfactant and a nonionic surfactant, the polarity and hydrophobicity can be controlled, and the graphite oxide is particularly suitably exfoliated into layers in a highly polar dispersion medium such as water or methanol. The reason for this is considered as follows. The nonionic surfactant, which has a weak aggregating force, does not aggregate the carbon material composite so strongly, and the carbon material composite easily disaggregates through exfoliation even in a highly polar dispersion medium, and can be redispersed in a dispersion medium. In other words, the use of a nonionic surfactant in combination with an amphoteric surfactant enables the control of the dispersibility.

The present inventors also found a method including: mixing an amphoteric surfactant, a cationic surfactant, and an aqueous dispersion obtained through oxidation, the aqueous dispersion containing graphite oxide dispersed therein; and purifying a carbon material composite containing the cationic surfactant, the amphoteric surfactant, and the graphite oxide. According to the method, the carbon material composite aggregates by the action of the cationic surfactant and the amphoteric surfactant even in the presence of residual acids in the aqueous dispersion to produce less dispersible large aggregates. Such aggregates are less likely to cause clogging of the filter when the aqueous dispersion is filtered, for example. Thereby, the duration of purifying can be greatly reduced and acids can be sufficiently removed. Thus, the carbon material composite can be purified very efficiently. The present inventors also found that with addition of an amphoteric surfactant as a single surfactant, the graphite oxide is suitably exfoliated particularly in a relatively highly polar organic solvent, while with simultaneous addition of an amphoteric surfactant and a cationic surfactant, the polarity and hydrophobicity can be controlled, and the graphite oxide is particularly suitably exfoliated into layers in a moderately polar dispersion medium such as a higher alcohol having about 4 to 12 carbon atoms.

The present inventors also found that a method including mixing an amphoteric surfactant, a nonionic surfactant, a cationic surfactant, and an aqueous dispersion obtained through oxidation, the aqueous dispersion containing graphite oxide dispersed therein, where the amphoteric surfactant, the nonionic surfactant, and the cationic surfactant are mixed in various ratios, can control the polarity and hydrophobicity of the carbon material composite owing to the above-described properties. For example, they found that the above combination is particularly suitable for exfoliation in an acyclic ester dispersion medium which is not particularly suitable for an amphoteric surfactant as a single surfactant, the combination of an amphoteric surfactant and a nonionic surfactant, and the combination of an amphoteric surfactant and a cationic surfactant. In other words, the use of an amphoteric surfactant, a nonionic surfactant, and a cationic surfactant mixed in various ratios enables the exfoliation in various solvents such as solvents having various functional groups, in particular, hydrophobic solvents, hydrophilic solvents, amphiphilic solvents, low-boiling point solvents, and high-boiling point solvents. Further, the dispersions of various solvents can be prepared.

The present inventors also found that an amphoteric surfactant having the following groups can control the degrees of hydrophobicity and polarity: a group substantially cationizable in an aqueous dispersion obtained through oxidation, the aqueous dispersion containing graphite oxide dispersed therein (a cationizable group), such as a quaternary ammonium salt group; a group substantially anionizable in the aqueous dispersion obtained through oxidation, the aqueous dispersion containing graphite oxide dispersed therein (an anionizable group), such as a carboxylic acid (salt) group, a sulfonic acid (salt) group, or a phosphoric acid (salt) group; and in addition, a relatively poorly polar hydrophilic group such as a polyoxyalkylene group. They also found that the use of a specific amphoteric surfactant as a single surfactant can achieve the same effects as those achieved by the use of an amphoteric surfactant and a nonionic surfactant in combination.

That is, the present invention relates to a method of producing a carbon material composite containing graphite oxide and at least one surfactant selected from the group consisting of a nonionic surfactant, a cationic surfactant, and an amphoteric surfactant, the method including:
  oxidizing graphite;
  mixing an aqueous dispersion obtained through the oxidizing, the aqueous dispersion containing graphite oxide dispersed therein, and the at least one surfactant selected from the group consisting of a nonionic surfactant, a cationic surfactant, and an amphoteric surfactant; and
  purifying the carbon material composite.

In a preferred embodiment of the method of producing a carbon material composite of the present invention, the purifying includes purifying the carbon material composite by at least one technique selected from the group consisting of filtration, decantation, centrifugation, and solvent extraction.

In another preferred embodiment of the method of producing a carbon material composite of the present invention, the mixing includes mixing the aqueous dispersion, the cationic surfactant, and the nonionic surfactant or mixing the aqueous dispersion, the amphoteric surfactant, and the nonionic surfactant and/or the cationic surfactant. In other words, in a preferred embodiment of the method of producing a carbon material composite of the present invention, the mixing includes mixing at least two surfactants selected from the group consisting of a nonionic surfactant, a cationic surfactant, and an amphoteric surfactant.

In still another preferred embodiment of the method of producing a carbon material composite of the present invention, the cationic surfactant has a cationizable group and a hydrophilic group with a lower polarity than the cationizable group.

In still another preferred embodiment of the method of producing a carbon material composite of the present invention, the amphoteric surfactant has a cationizable group, an anionizable group, and a hydrophilic group with a lower polarity than the cationizable group or the anionizable group.

Advantageous Effects of Invention

The method of producing a carbon material composite of the present invention can simply provide a high-quality carbon material composite at low cost. The carbon material composite obtained can be dispersed in a dispersion medium very well. Optionally, the polarity and hydrophobicity of the carbon material composite can be controlled using an appropriate combination of any of the surfactants in the present invention. The carbon material composite thus obtained can be suitably dispersed or exfoliated in a dispersion medium appropriate for the application. For example, a carbon material composite containing a cationic surfactant, a nonionic surfactant, and graphite oxide or a carbon material composite containing a cationic surfactant and graphite oxide, where the cationic surfactant has a cationizable group and a hydrophilic group with a lower polarity than the cationizable group, is suitably exfoliated into layers even when it is dispersed in a highly polar dispersion medium such as water. Further, a carbon material composite containing a nonionic surfactant and/or a cationic surfactant, an amphoteric surfactant, and graphite oxide can be suitably exfoliated into layers even when it is dispersed in a highly polar dispersion medium such as water. The carbon material composite obtained can be dispersed in a resin-based dispersion medium very well. Owing to the above-described effects, the carbon material composite can be dispersed very well not only in a common aqueous solvent and an organic solvent but also in a resin-based dispersion medium such as a resin precursor monomer. Similarly, optionally, the polarity and hydrophobicity of the carbon material composite can be controlled using an appropriate combination of any of the surfactants in the present invention. The carbon material composite thus obtained can be suitably dispersed in a resin-based dispersion medium appropriate for the application.

DESCRIPTION OF EMBODIMENTS

The present invention is described in detail below.

The following describes preferred features of the present invention in the respective paragraphs, and the embodiments of any combinations of two or more of the preferred features are also preferred embodiments of the present invention.

Herein, for example, any combination of two or more of the following preferred embodiments of the first aspect of the present invention, the second aspect of the present invention, and the third aspect of the present invention is also a preferred embodiment of the present invention.

Unless otherwise specified, "the present invention" refers to a combination of any of the first aspect of the present invention, the second aspect of the present invention, and the third aspect of the present invention.

<Method of Producing Carbon Material Composite>

In the method of producing a carbon material composite of the present invention, the steps following the oxidation may be performed in any order. The method may optionally further include the below-described oxidation reaction termination (quenching) as needed. The oxidation reaction termination, the mixing, and the purifying are particularly preferably performed in this order. The method may further appropriately include purifying the graphite oxide before the mixing. For example, optional oxidation reaction termination, purification of the graphite oxide, the mixing, and the purifying the carbon material composite may be performed in this order. Alternatively, purification may be performed during the mixing as described below (for example, when a step of mixing part of surfactants is referred to as first mixing and a step of mixing the rest of the surfactants is referred to as second mixing, the purifying may be performed between the first mixing and the second mixing). After optional oxidation reaction termination, the first mixing, the purifying, and the second mixing may be performed in this order.

The carbon material composite obtainable by the method of producing a carbon material composite of the present invention contains graphite oxide and at least one surfactant selected from the group consisting of a nonionic surfactant, a cationic surfactant, and an amphoteric surfactant.

In particular, in a preferred embodiment of the carbon material composite obtainable by the method of producing a carbon material composite of the present invention, the carbon material composite contains a cationic surfactant, a nonionic surfactant, and graphite oxide or contains an amphoteric surfactant, a nonionic surfactant and/or a cationic surfactant, and graphite oxide.

For example, a carbon material composite obtainable by a method of producing a carbon material composite according to the second aspect of the present invention contains a cationic surfactant and graphite oxide, and may optionally further contain a nonionic surfactant.

Further, a carbon material composite obtainable by a method of producing a carbon material composite according to the third aspect of the present invention contains an amphoteric surfactant and graphite oxide, and may optionally further contain a nonionic surfactant and/or a cationic surfactant.

The graphite oxide is prepared by oxidizing a graphitic carbon material such as graphene or graphite to contain oxygen bonded thereto (oxygen is bonded to the carbon material). The oxygen is present in the graphitic carbon material in the form of a substituent such as a carboxyl, carbonyl, hydroxy, or epoxy group.

The graphite oxide is preferably graphene oxide in which oxygen is bonded to the carbon of graphene.

Generally, graphene refers to a sheet in which carbon atoms are bonded to each other through $sp^2$ bonding and arranged in a planar single layer, and a laminate of a large number of such graphene sheets refers to graphite. The graphene oxide in the present invention encompasses not only a sheet consisting of a single layer of carbon atoms, but also a laminate of about 2 to 100 layers. The graphene oxide is preferably in the form of a sheet consisting of a single layer of carbon atoms or in the form of a laminate of about 2 to 20 layers.

Also, the graphite oxide may contain a functional group such as a sulfur-containing group or a nitrogen-containing group, and the amount of carbon, hydrogen, and oxygen contained as constituent elements is preferably 97 mol % or more, more preferably 99 mol % or more of all the constituent elements. The graphite oxide still more preferably consists of only carbon, hydrogen, and oxygen as constituent elements.

First, the following describes first the mixing of a surfactant and the aqueous dispersion obtained through the oxidizing, the aqueous dispersion containing graphite oxide dispersed therein, and then the purifying the carbon material composite in the method of producing a carbon material composite of the present invention, in this order. Here, the purification is described in the description of the mixing because the purification may be performed during the mixing as described below (for example, when a step of mixing part of surfactants is referred to as first mixing and a step of mixing the rest of the surfactants is referred to as second mixing, the purification may be performed between the first mixing and the second mixing). Subsequently, the exfoliation of the graphite oxide in the carbon material composite purified in the purification and the oxidation of graphite before the purification are described.

(Mixing)

The production method of the present invention includes mixing an aqueous dispersion obtained through the oxidizing, the aqueous dispersion containing graphite oxide dispersed therein, and at least one surfactant selected from the group consisting of a nonionic surfactant, a cationic surfactant, and an amphoteric surfactant.

In the mixing, the surfactant may be added to the aqueous dispersion, the aqueous dispersion may be added to the surfactant, or the aqueous dispersion and the surfactant may be simultaneously added to a vessel.

The mixing herein may be performed by any technique and can be appropriately performed by a known technique. For example, it is preferably performed by stirring or ultrasonication or using a known disperser to homogeneously disperse solids.

In the present invention, the aqueous dispersion obtained through the oxidizing, the aqueous dispersion containing graphite oxide dispersed therein, may be a reaction composition immediately after the oxidation or may be a liquid prepared by removing sulfuric acid from the reaction composition in the subsequent concentration or by adding water and/or hydrogen peroxide water to the reaction composition in the oxidation reaction termination. For example, preferred is a liquid prepared by adding water and/or hydrogen peroxide water to the reaction composition in the oxidation reaction termination.

The aqueous dispersion has only to contain water as a dispersion medium, and may further contain an organic dispersion medium miscible with water. To easily aggregate the carbon material composite, the aqueous dispersion is preferably free from organic dispersion media.

Herein, the nonionic surfactant according to the first aspect of the present invention is a compound that is not substantially ionized in the aqueous dispersion obtained through the oxidizing, the aqueous dispersion containing graphite oxide dispersed therein, among those having a hydrophobic group and a hydrophilic group, that is, common surfactants.

The graphite oxide hydrophobically interacts with the nonionic surfactant so that they aggregate together as a carbon material composite. This can lead to efficient purification such as filtration, and thus can achieve a reduction in cost of the production of the carbon material composite.

Preferred examples of the hydrophobic group of the nonionic surfactant include a hydrocarbon group such as an aliphatic hydrocarbon group or an aromatic hydrocarbon group. The number of carbon atoms of the hydrocarbon group is preferably 3 or more, more preferably 4 or more, still more preferably 5 or more, still further more preferably 6 or more, particularly preferably 9 or more. The number of carbon atoms of the hydrocarbon group is preferably 24 or less, for example. Preferred examples of the hydrophilic group of the nonionic surfactant include an alkylene oxide group, an ether group, an ester group, an amide group, and a hydroxy group. The alkylene oxide group is more preferably an ethylene oxide group.

Preferred examples of the nonionic surfactant include polyoxyethylene alkyl ethers, polyoxyethylene alkenyl ethers, polyoxyethylene alkyl phenyl ethers, higher fatty acid alkanolamides and adducts of ethylene oxide therewith, sucrose fatty acid esters, alkyl glycoxydes, fatty acid glycerol monoesters, alcohol ethoxylates, sorbitan esters, polyoxyethylene sorbitan esters, and derivatives thereof. Each of these may be used alone or two or more of these may be used in combination. Particularly preferred examples of the nonionic surfactant include alcohol ethoxylates containing a hydroxy-terminated (—OH group-terminated) (poly)ethylene glycol chain (e.g., SOFTANOL 50 and SOFTANOL 120 available from Nippon Shokubai Co., Ltd.) and polyoxyethylene sorbitan esters (e.g., NEWCOL 85 available from Nippon Nyukazai Co., Ltd.).

Unless otherwise specified, when a nonionic surfactant is used in the method of producing a carbon material composite of the present invention, it may be the same as the nonionic surfactant according to the first aspect of the present invention.

In the mixing, the amount of the nonionic surfactant to be mixed with the aqueous dispersion may be appropriately set. It is preferably 10 to 1000% by mass per 100% by mass of the graphite oxide in the aqueous dispersion. The amount of the nonionic surfactant is more preferably 20 to 700% by mass, still more preferably 30 to 600% by mass, particularly preferably 40 to 500% by mass per 100% by mass of the graphite oxide in the aqueous dispersion.

A preferred amount of sulfate ions, preferred pH, and preferred water concentration of the aqueous dispersion before mixing with the surfactant in a method of producing a carbon material composite according to the first aspect of the present invention are the same as the preferred amount of sulfate ions, preferred pH, and preferred water concentration of the aqueous dispersion before mixing with the surfactant in the method of producing a carbon material composite of the present invention as described below.

Herein, the cationic surfactant according to the second aspect of the present invention is a compound that has a cationizable group as a hydrophilic group but does not have an anionizable group among those having a hydrophobic group and a hydrophilic group, that is, common surfactants. In other words, the cationic surfactant is a compound substantially cationizable in the aqueous dispersion obtained through the oxidizing, the aqueous dispersion containing graphite oxide dispersed therein.

The graphite oxide interacts with the cationic surfactant. Thereby, the graphite oxide has a hydrophobic surface, highly interacts with an organic dispersion medium, and can be exfoliated into layers.

Preferred examples of the hydrophobic group of the cationic surfactant include a hydrocarbon group such as an aliphatic hydrocarbon group or an aromatic hydrocarbon group. The number of carbon atoms of the hydrocarbon group is preferably 3 or more, more preferably 4 or more, still more preferably 5 or more, still further more preferably 6 or more, particularly preferably 9 or more. The number of carbon atoms of the hydrocarbon group is preferably 24 or less, for example. The hydrophilic group of the cationic surfactant is preferably a group that is substantially cationizable in the aqueous dispersion obtained through the oxidizing, the aqueous dispersion containing graphite oxide dispersed therein (herein, the group is also referred to as a cationizable group). Preferred examples of the cationizable group include a quaternary ammonium salt group, a pyridinium salt group, and an amine group. The number of types of each of the hydrophobic group and the hydrophilic group is not limited to one. For example, the cationic surfactant may further have as a hydrophilic group a relatively poorly polar functional group (poorly polar hydrophilic group) such as a polyoxyalkylene group (e.g., a polyoxyethylene group, a polyoxypropylene group), an ether group, an ester group, or a hydroxy group, as well as a cationizable group (highly polar hydrophilic group) such as a quaternary ammonium salt group, a pyridinium salt group, or an amine group, in one molecule. The use of the cationic surfactant having a cationizable group and a hydrophilic group with a lower polarity than the cationizable group can control the degrees of hydrophilicity and polarity. Thus, the use of only one type of molecule (the cationic surfactant as a single surfactant) can achieve the same effects as those achieved by the use of the cationic surfactant and the nonionic surfactant in combination. In other words, the cationic surfactant preferably has a cationizable group and a hydrophilic group with a lower polarity than the cationizable group. The hydrophilic group with a lower polarity than the cationizable group is preferably a polyoxyalkylene group containing a C2-C3 alkylene group.

Preferred examples of the cationic surfactant include quaternary ammonium salts such as a benzalkonium salt, a tributylmethylammonium salt, a dimethyldistearylammonium salt, a trimethylstearylammonium salt, a benzyltributylammonium salt, and a tris(polyoxyalkylene)dodecylammonium salt (e.g., Texnol L7 available from Nippon Nyukazai Co., Ltd.); pyridinium salts such as a lauryl (dodecyl) pyridinium salt and a cetyl pyridinium salt; fatty acid amide amines such as stearamide propyl dimethylamine and stearamide ethyl diethylamine; alkyl ether amines such as stearoxypropyl dimethylamine; polyoxyethylene alkylamines; and alkyl imidazolines. Each of these may be used alone or two or more of these may be used in combination. Preferred among these cationic surfactants are quaternary ammonium salts and pyridinium salts. The quaternary ammonium salts and the pyridinium salts are preferably halides or hydroxides. The halides are preferably chlorides.

Unless otherwise specified, when a cationic surfactant is used in the method of producing a carbon material composite of the present invention, it may be the same as the cationic surfactant according to the second aspect of the present invention.

In the mixing, the amount of the cationic surfactant to be mixed with the aqueous dispersion containing graphite oxide dispersed therein may be appropriately set. It is preferably 10 to 1000% by mass per 100% by mass of the graphite oxide dispersed in the aqueous dispersion. The amount of the cationic surfactant is more preferably 20 to 700% by mass, still more preferably 25 to 600% by mass, particularly preferably 30 to 500% by mass per 100% by mass of the graphite oxide dispersed in the aqueous dispersion.

In the production method of the second aspect of the present invention, the mixing preferably further includes mixing a nonionic surfactant. Thereby, as described above, the duration of purification can be further reduced and acids can be sufficiently removed in the subsequent purification. Thus, the carbon material composite can be purified very efficiently. Also, the graphite oxide in the carbon material composite can be exfoliated into layers even in the aqueous dispersion medium.

When the mixing further includes mixing a nonionic surfactant, the materials may be mixed in any order. For example, the mixing may include first mixing of mixing a nonionic surfactant and the aqueous dispersion obtained through the oxidizing, the aqueous dispersion containing graphite oxide dispersed therein, and second mixing of mixing a cationic surfactant and the aqueous dispersion containing graphite oxide and the nonionic surfactant dispersed therein. Alternatively, a nonionic surfactant and a cationic surfactant may be simultaneously mixed with the aqueous dispersion obtained through the oxidizing, the aqueous dispersion containing graphite oxide dispersed therein.

During the mixing, purification may be performed. In other words, when a step of mixing part of the surfactants is referred to as first mixing and a step of mixing the rest of the surfactants is referred to as second mixing, the purification may be performed between the first mixing and the second mixing. For example, when the mixing includes the first mixing of mixing a nonionic surfactant and the aqueous dispersion obtained through the oxidizing, the aqueous dispersion containing graphite oxide dispersed therein, and the second mixing of mixing a cationic surfactant and the aqueous dispersion containing the nonionic surfactant and graphite oxide dispersed therein, the carbon material composite containing the nonionic surfactant and graphite oxide may be purified from the liquid mixture obtained in the first mixing between the first mixing and the second mixing. In this way, sulfuric acid may be sufficiently washed away between the first mixing and the second mixing in advance. Thereby, in the subsequent second mixing, the acid groups of the graphite oxide are ionized and the graphite oxide more strongly interacts with the cationic surfactant. As a result, the effect of exfoliating the graphite oxide into layers in an organic dispersion medium is markedly achieved. Alternatively, between the first mixing and the second mixing, the carbon material composite may be purified by, for example, at least one technique selected from the group consisting of filtration, decantation, centrifugation, and solvent extraction and then may be further washed with water as needed. The purification is described in detail after the description of the mixing.

In the first mixing, a nonionic surfactant may be added to the aqueous dispersion, the aqueous dispersion may be added to the nonionic surfactant, or the aqueous dispersion and the nonionic surfactant may be simultaneously added to a vessel. The same is applied to the second mixing. Specifically, the cationic surfactant may be added to the aqueous dispersion, the aqueous dispersion may be added to the cationic surfactant, or the aqueous dispersion and the cationic surfactant may be simultaneously added to a vessel.

When the nonionic surfactant and the cationic surfactant are simultaneously mixed with the aqueous dispersion obtained through the oxidizing, the aqueous dispersion containing graphite oxide dispersed therein, for example, the nonionic surfactant and the cationic surfactant may be simultaneously added to the aqueous dispersion, or alternatively, the aqueous dispersion, the nonionic surfactant, and the cationic surfactant may be simultaneously added to a vessel.

The nonionic surfactant is the same as the nonionic surfactant according to the first aspect of the present invention.

The graphite oxide hydrophobically interacts with the nonionic surfactant so that they aggregate together. This can lead to efficient purification such as filtration, and thus can achieve a reduction in cost of the production of the carbon material composite.

In the mixing, the amount of the nonionic surfactant to be mixed with the aqueous dispersion may be appropriately set. It is preferably 10 to 1000% by mass per 100% by mass of the graphite oxide in the aqueous dispersion. The amount of the nonionic surfactant is more preferably 20 to 700% by mass, still more preferably 30 to 600% by mass, particularly preferably 40 to 500% by mass per 100% by mass of the graphite oxide in the aqueous dispersion.

A preferred amount of sulfate ions, preferred pH, and preferred water concentration of the aqueous dispersion before mixing with the surfactants in the method of producing a carbon material composite according to the second aspect of the present invention are the same as the preferred amount of sulfate ions, preferred pH, and preferred water concentration of the aqueous dispersion before mixing with the surfactants in the method of producing a carbon material composite of the present invention as described below.

When the mixing further includes mixing a nonionic surfactant in the method of producing a carbon material composite according to the second aspect of the present invention, an unexpected effect is expressed that the graphite oxide interacts with the nonionic surfactant so that they aggregate together in the presence of a strong acid such as sulfuric acid that has been used in the oxidation or the like, more markedly achieving the effects of the present invention.

As described above, the purification may be performed during the mixing. For example, when the production method of the second aspect of the present invention includes the first mixing of mixing a nonionic surfactant and the aqueous dispersion obtained through the oxidizing, the aqueous dispersion containing graphite oxide dispersed therein, and the second mixing of mixing a cationic surfactant and the aqueous dispersion containing graphite oxide and the nonionic surfactant dispersed therein, the liquid mixture obtained in the first mixing may be purified between the first mixing and the second mixing as described above. Thereby, in the subsequent second mixing, the graphite oxide more strongly interacts with the cationic surfactant. For example, the aqueous dispersion containing the nonionic surfactant and graphite oxide dispersed therein preferably contains 10% by mass or less of sulfate ions relative to 100% by mass of the aqueous dispersion. The amount of sulfate ions is more preferably 5% by mass or less, still more preferably 1% by mass or less, particularly preferably 0.1% by mass or less. The lower limit of the amount of sulfate ions is not limited and may be 0% by mass.

The aqueous dispersion containing the nonionic surfactant and graphite oxide dispersed therein preferably has a pH of 2 to 10, more preferably 9 or less, still more preferably 8 or less.

In the method of producing a carbon material composite according to the second aspect of the present invention, the aqueous dispersion containing the nonionic surfactant and graphite oxide dispersed therein preferably has a water concentration of 20% by mass or higher relative to 100% by mass of the aqueous dispersion.

The water concentration is more preferably 25% by mass or higher, still more preferably 30% by mass or higher, particularly preferably 35% by mass or higher.

The water concentration is, for example, preferably 99% by mass or lower, more preferably 95% by mass or lower.

In the mixing, first, the aqueous dispersion obtained through the oxidizing, the aqueous dispersion containing graphite oxide dispersed therein, may be mixed with a cationic surfactant, followed by mixing with a nonionic surfactant. Preferred embodiments of this case are the same as those of the case where, in the mixing, the aqueous dispersion obtained through the oxidizing, the aqueous dispersion containing graphite oxide dispersed therein, is first mixed with a nonionic surfactant, followed by mixing with a cationic surfactant.

Herein, the amphoteric surfactant according to the third aspect of the present invention is a compound that has a cationizable group and an anionizable group as hydrophilic groups among those having a hydrophobic group and a hydrophilic group, that is, common surfactants. In other words, the amphoteric surfactant is substantially ionized to give an amphoteric ion in the aqueous dispersion obtained through the oxidizing, the aqueous dispersion containing graphite oxide dispersed therein.

The graphite oxide interacts with the cationizable group of the amphoteric surfactant. Thereby, the hydrophobic group and anionizable group of the amphoteric surfactant are directed outward to make surfaces of the graphite oxide slightly anionic. The graphite oxide thus highly interacts with a relatively highly polar organic dispersion medium and can be exfoliated into layers.

Preferred examples of the hydrophobic group of the amphoteric surfactant include a hydrocarbon group such as an aliphatic hydrocarbon group or an aromatic hydrocarbon group. The number of carbon atoms of the hydrocarbon group is preferably 3 or more, more preferably 4 or more, still more preferably 5 or more. The number of carbon atoms of the hydrocarbon group is preferably 24 or less, for example. The amphoteric surfactant contains as hydrophilic groups a cationizable group and an anionizable group. Preferred examples of the cationizable group include a quaternary ammonium salt group, a pyridinium salt group, and an amine group. Preferred examples of the anionizable group include a carboxylic acid (salt) group, a sulfonic acid (salt) group, and a phosphoric acid (salt) group. The number of types of each of the hydrophobic group, the cationizable group, and the anionizable group is not limited to one. For example, the amphoteric surfactant may have a relatively poorly polar functional group (poorly polar hydrophilic group) such as a polyoxyalkylene group (e.g., a polyoxyethylene group, a polyoxypropylene group), an ether group, an ester group, or a hydroxy group, as well as a cationizable group and an anionizable group (which are both highly polar hydrophilic groups), in one molecule. The use of the amphoteric surfactant having a cationizable group, an anionizable group, and a hydrophilic group with a lower polarity than the cationizable group or the anionizable group can control the degrees of hydrophobicity and polarity. Thus, the use of only one molecule (the amphoteric surfactant) can achieve the same effects as those achieved by the use of the amphoteric surfactant and the nonionic surfactant in combination. In other words, the amphoteric surfactant preferably has a cationizable group, an anionizable group, and a hydrophilic group with a lower polarity than the cationizable group or the anionizable group. Examples of the poorly polar hydrophilic group include a polyoxyalkylene group, an ether group, an ester group, and a hydroxy group. Preferred is a polyoxyalkylene group containing a C2-C3 alkylene group. Further, for example, the use of the amphoteric surfactant having multiple types of cationizable groups can control the degrees of hydrophobicity and polarity. Thus, the use of such a specific amphoteric surfactant as a single surfactant can achieve the same effects as those achieved by the use of the amphoteric surfactant and the cationic surfactant in combination as described above.

Examples of the amphoteric surfactant include an alkyldimethylaminoacetic acid betaine, an alkyldimethylamine oxide, an alkylcarboxymethyl imidazolinium betaine, an alkyl amidopropyl betaine, and an alkyl sulfobetaine. One or two or more of these may be used. Preferred among these amphoteric surfactants is an alkyldimethylaminoacetic acid betaine, with lauryldimethylaminoacetic acid betaine (lauryl betaine) being more preferred. When the cationizable group is in the form of a salt, the salt is preferably a halide or hydroxide. The halide is preferably a chloride. When the anionizable group is in the form of a salt, the salt is preferably an alkali metal salt. The alkali metal salt is preferably a sodium salt or potassium salt. Unless otherwise specified, when the amphoteric surfactant is used in the method of producing a carbon material composite of the present invention, it may be the same as the amphoteric surfactant according to the third aspect of the present invention.

In the mixing, the amount of the amphoteric surfactant to be mixed with the aqueous dispersion containing graphite oxide dispersed therein may be appropriately set. It is preferably 10 to 1000% by mass per 100% by mass of the graphite oxide dispersed in the aqueous dispersion. The amount of the amphoteric surfactant is more preferably 20 to 700% by mass, still more preferably 25 to 600% by mass, particularly preferably 30 to 500% by mass per 100% by mass of the graphite oxide dispersed in the aqueous dispersion.

In the production method of the third aspect of the present invention, the mixing preferably further includes mixing a nonionic surfactant and/or a cationic surfactant. Thereby, the duration of purification can be further reduced and acids can be sufficiently removed in the subsequent purification as described above. Thus, the carbon material composite can be purified very efficiently. Also, the graphite oxide in the carbon material composite can be exfoliated into layers even in various dispersion media.

When the mixing further includes mixing a nonionic surfactant and/or a cationic surfactant, the materials may be mixed in any order. For example, the mixing may include first mixing of mixing a nonionic surfactant and/or a cationic surfactant and the aqueous dispersion obtained through the oxidizing, the aqueous dispersion containing graphite oxide dispersed therein, and second mixing of mixing an amphoteric surfactant and the aqueous dispersion containing the nonionic surfactant and/or the cationic surfactant and graphite oxide dispersed therein. Alternatively, a nonionic surfactant and/or a cationic surfactant and an amphoteric surfactant may be simultaneously mixed with the aqueous dispersion obtained through the oxidizing, the aqueous dispersion containing graphite oxide dispersed therein.

As described above, during the mixing, purification may be performed. In other words, when a step of mixing part of the surfactants is referred to as first mixing and a step of mixing the rest of the surfactants is referred to as second mixing, the purification may be performed between the first mixing and the second mixing. For example, when the mixing includes the first mixing of mixing a nonionic surfactant and/or a cationic surfactant and the aqueous dispersion obtained through the oxidizing, the aqueous dispersion containing graphite oxide dispersed therein, and the second mixing of mixing an amphoteric surfactant and the aqueous dispersion containing the nonionic surfactant and/or the cationic surfactant and graphite oxide dispersed therein, the carbon material composite containing the nonionic surfactant and/or the cationic surfactant and graphite oxide may be purified from the liquid mixture obtained in the first mixing between the first mixing and the second mixing. The purification may be performed by any technique, and any known technique may be used as appropriate. For example, the purification is preferably performed by at least one technique selected from the group consisting of filtration, decantation, centrifugation, and solvent extraction. In this way, sulfuric acid may be sufficiently washed away between the first mixing and the second mixing in advance. Thereby, in the subsequent second mixing, the acid groups of the graphite oxide are ionized and the graphite oxide more strongly interacts with the amphoteric surfactant. As a result, the effect of exfoliating the graphite oxide into layers in an organic dispersion medium is markedly achieved. Alternatively, between the first mixing and the second mixing, the carbon material composite may be purified by, for example, at least one technique selected from the group consisting of filtration, decantation, centrifugation, and solvent extraction and then may be further washed with water as needed. The purification is described in detail after the description of the mixing.

In the first mixing, a nonionic surfactant and/or a cationic surfactant may be added to the aqueous dispersion, the aqueous dispersion may be added to a nonionic surfactant and/or a cationic surfactant, or the aqueous dispersion and a nonionic surfactant and/or a cationic surfactant may be simultaneously added to a vessel. The same is applied to the second mixing. Specifically, an amphoteric surfactant may be added to the aqueous dispersion, the aqueous dispersion may be added to an amphoteric surfactant, or the aqueous dispersion and an amphoteric surfactant may be simultaneously added to a vessel.

When a nonionic surfactant and/or a cationic surfactant and an amphoteric surfactant are simultaneously mixed with the aqueous dispersion obtained through the oxidizing, the aqueous dispersion containing graphite oxide dispersed therein, for example, the nonionic surfactant and/or the cationic surfactant and the amphoteric surfactant may be simultaneously added to the aqueous dispersion, or alternatively, the aqueous dispersion, the nonionic surfactant and/or the cationic surfactant, and the amphoteric surfactant may be simultaneously added to a vessel.

The nonionic surfactant is the same as the nonionic surfactant according to the first aspect of the present invention, and the cationic surfactant is the same as the cationic surfactant according to the second aspect of the present invention.

The graphite oxide hydrophobically and/or ionically interacts with the nonionic surfactant and/or the cationic surfactant so that they aggregate together. This can lead to efficient purification such as filtration, and thus can achieve a reduction in cost of the production of the carbon material composite.

In the mixing, the amount of the nonionic surfactant and/or the cationic surfactant to be mixed with the aqueous dispersion may be appropriately set. It is preferably 10 to 1000% by mass per 100% by mass of the graphite oxide in the aqueous dispersion. The amount of the nonionic surfactant and/or the cationic surfactant is more preferably 20 to 700% by mass, still more preferably 30 to 600% by mass, particularly preferably 40 to 500% by mass per 100% by mass of the graphite oxide in the aqueous dispersion.

When the nonionic surfactant and the cationic surfactant are used in combination, the amount of the nonionic surfactant and/or the cationic surfactant refers to the combined amount of the nonionic surfactant and the cationic surfactant.

A preferred amount of sulfate ions, preferred pH, and preferred water concentration of the aqueous dispersion before mixing with the surfactants in the method of producing a carbon material composite according to the third aspect of the present invention are the same as the preferred amount of sulfate ions, preferred pH, and preferred water concentration of the aqueous dispersion before mixing with the surfactants in the method of producing a carbon material composite of the present invention described below.

When the mixing further includes mixing a nonionic surfactant and/or a cationic surfactant in the method of producing a carbon material composite according to the third aspect of the present invention, an unexpected effect is expressed that the graphite oxide interacts with the nonionic surfactant and/or the cationic surfactant so that they aggregate together in the presence of a strong acid such as sulfuric acid that has been used in the oxidation or the like, more markedly achieving the effects of the present invention.

As described above, the purification may be performed during the mixing. For example, when the method of producing a carbon material composite according to the third aspect of the present invention includes the first mixing of mixing a nonionic surfactant and/or a cationic surfactant and the aqueous dispersion obtained through the oxidizing, the aqueous dispersion containing graphite oxide dispersed therein, and the second mixing of mixing an amphoteric surfactant and the aqueous dispersion containing the nonionic surfactant and/or the cationic surfactant and graphite oxide dispersed therein, the liquid mixture obtained in the first mixing may be purified between the first mixing and the second mixing as described above.

Thereby, in the subsequent second mixing, the graphite oxide more strongly interacts with the amphoteric surfactant. For example, the aqueous dispersion containing the nonionic surfactant and/or the cationic surfactant and graphite oxide dispersed therein preferably contains 10% by mass or less of sulfate ions relative to 100% by mass of the aqueous dispersion. The amount of sulfate ions is more preferably 5% by mass or less, still more preferably 1% by mass or less, particularly preferably 0.1% by mass or less. The lower limit of the amount of sulfate ions is not limited and may be 0% by mass.

The aqueous dispersion containing the nonionic surfactant and/or the cationic surfactant and graphite oxide dispersed therein preferably has a pH of 2 to 10, more preferably 9 or less, still more preferably 8 or less.

In the method of producing a carbon material composite according to the third aspect of the present invention, the aqueous dispersion containing the nonionic surfactant and/or the cationic surfactant and graphite oxide dispersed therein preferably has a water concentration of 20% by mass or higher relative to 100% by mass of the aqueous dispersion.

The water concentration is more preferably 25% by mass or higher, still more preferably 30% by mass or higher, particularly preferably 35% by mass or higher.

The water concentration is, for example, preferably 99% by mass or lower, more preferably 95% by mass or lower.

In the mixing, first, the aqueous dispersion obtained through the oxidizing, the aqueous dispersion containing graphite oxide dispersed therein, may be mixed with an amphoteric surfactant, followed by mixing with a nonionic surfactant and/or a cationic surfactant. Preferred embodiments of this case are the same as those of the above-described case where, in the mixing, the aqueous dispersion obtained through the oxidizing, the aqueous dispersion containing graphite oxide dispersed therein, is first mixed with a nonionic surfactant and/or a cationic surfactant, followed by mixing with an amphoteric surfactant.

In the method of producing a carbon material composite of the present invention, the aqueous dispersion obtained through the oxidizing, the aqueous dispersion containing graphite oxide dispersed therein (aqueous dispersion before mixing with the surfactants), preferably has a water concentration of 20% by mass or higher relative to 100% by mass of the aqueous dispersion.

The water concentration is more preferably 25% by mass or higher, still more preferably 30% by mass or higher, particularly preferably 35% by mass or higher.

With the water concentration within the above ranges, an unexpected effect is more sufficiently expressed that the graphite oxide interacts with at least one surfactant selected from the group consisting of a nonionic surfactant, a cationic surfactant, and an amphoteric surfactant so that they aggregate together even in the presence of sulfuric acid that has been used in the oxidation or the like, achieving better the effects of the present invention.

The water concentration is, for example, preferably 99% by mass or lower, more preferably 95% by mass or lower.

In the method of producing a carbon material composite of the present invention, when the mixing further includes mixing a nonionic surfactant and/or a cationic surfactant, an unexpected effect is more sufficiently expressed that the graphite oxide interacts with the nonionic surfactant and/or the cationic surfactant so that they aggregate together in the presence of a strong acid such as sulfuric acid that has been used in the oxidation or the like, achieving much better the effects of the present invention. In particular, when the mixing includes mixing a nonionic surfactant, the above-described action is more sufficiently expressed and the effects of the present invention can be much better and markedly achieved.

In the method of producing a carbon material composite of the present invention, the aqueous dispersion to be mixed with the surfactants preferably contains 1% by mass or more of sulfate ions relative to 100% by mass of the aqueous dispersion.

The amount of sulfate ions is more preferably 3% by mass or more, still more preferably 5% by mass or more. The amount of sulfate ions is preferably 90% by mass or less, more preferably 70% by mass or less.

The amount of sulfate ions refers to the combined amount of sulfate ions derived from sulfuric acid and sulfate ions derived from sulfates.

Further, the aqueous dispersion preferably has a pH of 2 or lower, more preferably 1.5 or lower. The lower limit of the pH is not limited, and is usually −1 or higher.

According to the present invention, an unexpected effect is expressed that the graphite oxide interacts with the surfactants so that they aggregate together in the presence of a strong acid such as sulfuric acid that has been used in the oxidation or the like, achieving the effects of the present invention.

(Purification of Carbon Material Composite)

The method of producing a carbon material composite of the present invention includes purifying the carbon material composite after the completion of the mixing of the aqueous dispersion containing graphite oxide and the surfactants or between the first mixing and the second mixing when the mixing includes the first mixing and the second mixing as described above. The purifying may be performed by any technique, and any known technique may be used as appropriate. The purifying is preferably performed by at least one technique selected from the group consisting of filtration, decantation, centrifugation, and solvent extraction, for example.

In particular, the purifying is preferably performed after the completion of the mixing of the aqueous dispersion and the surfactants. When the purifying is performed between the first mixing and the second mixing, the rest of the surfactants is mixed with the carbon material composite obtained through the purifying. Thus, the carbon material composite to be purified does not contain the rest of the surfactants, and in this respect, it is different from the final carbon material composite obtained by the production method of the present invention.

These methods can efficiently and sufficiently remove sulfuric acid from the aqueous dispersion and can purify the carbon material composite in a short time. This can sufficiently prevent reduction and/or inactivation of reactive oxygen-containing functional groups of the graphite oxide in the carbon material composite when the carbon material composite is purified. Thus, a high-quality carbon material composite can be obtained. Herein, the purifying refers to a step of removing solid impurities (e.g., oxidants such as permanganate) and/or solvents (e.g., strong acid such as sulfuric acid) used in the oxidation reaction from the aqueous dispersion.

Among these methods, filtration and solvent extraction are more preferred, with filtration being still more preferred. In the purifying, since the surfactants in the present invention act on the carbon material composite particles in the aqueous dispersion to promote aggregation of the particles to provide large aggregates of the carbon material composite particles, the aqueous dispersion, when filtered, is less likely to cause clogging of the filter, and the filtration can be completed in a very short time. When the mixing includes mixing a nonionic surfactant, the nonionic surfactant, which has a weak aggregating force, does not aggregate the carbon material composite so strongly. Thus, water can enter the aggregates and sufficiently wash away the sulfuric acid. When the mixing includes mixing a cationic surfactant, the graphite oxide interacts with the cationizable group of the cationic surfactant, and thus, the hydrophobic group of the cationic surfactant is directed outward to make surfaces of the graphite oxide hydrophobic. This hydrophobicity allows removal of highly polar sulfuric acid. Thus, a high-quality carbon material composite can be very simply produced by purifying the carbon material composite by filtration.

The carbon material composite according to the second aspect of the present invention to be purified may contain a cationic surfactant and graphite oxide. It may further contain a nonionic surfactant when the mixing further includes mixing a nonionic surfactant before the purifying.

The carbon material composite according to the third aspect of the present invention to be purified may contain an amphoteric surfactant and graphite oxide. It may further contain a nonionic surfactant and/or a cationic surfactant when the mixing further includes mixing a nonionic surfactant and/or a cationic surfactant before the purification.

In the method of producing a carbon material composite of the present invention, to more simply obtain the carbon material composite, the purification is preferably performed by any one or two of the above-described techniques, more preferably by any one of the techniques. In a preferred embodiment of the production method of the present invention, each method is completed in one cycle without repeating.

To more sufficiently purify the carbon material composite, each technique is preferably repeated. In a preferred embodiment of the production method of the present invention, at least one technique selected from the group consisting of filtration, decantation, centrifugation, and solvent extraction is repeated.

The purification may be performed in the air or in an inert gas atmosphere, such as in a nitrogen, helium, or argon atmosphere. The purification may also be performed under increased pressure, atmospheric pressure, or reduced pressure conditions.

The production method of the present invention may further include different purification such as washing with water after the purification of the carbon material composite by at least one technique selected from the group consisting of filtration, decantation, centrifugation, and solvent extraction, for example. When washing with water is performed after the purification, the washing with water is preferably performed, for example, at least once, more preferably twice or more so as to more sufficiently remove sulfuric acid and allow the graphite oxide to be more suitably exfoliated into layers in the exfoliation described later. In order not to remove excessively at least one surfactant selected from the group consisting of a nonionic surfactant, a cationic surfactant, and an amphoteric surfactant (the surfactants used) from the carbon material composite obtained by the production method of the present invention, the washing with water is preferably performed, for example, 10 times or less, more preferably 7 times or less. Also in order not to remove excessively at least one surfactant selected from the group consisting of a nonionic surfactant, a cationic surfactant, and an amphoteric surfactant, the washing may be performed with, instead of water, a liquid mixture containing water and at least one surfactant selected from the group consisting of a nonionic surfactant, a cationic surfactant, and an amphoteric surfactant. Further, the use of the washing liquid prepared enables control of the ratio between the graphite oxide and the surfactants in the final carbon material composite containing graphite oxide and at least one surfactant selected from the group consisting of a nonionic surfactant, a cationic surfactant, and an amphoteric surfactant.

(Exfoliation)

The production method of the present invention preferably further includes exfoliating into layers the graphite oxide in the carbon material composite purified in the purifying. The exfoliation is a step of exfoliating the graphite oxide into layers as described above, and can be performed by treatment such as ultrasonication or homogenizer treatment. Usually, the carbon material composite containing the graphite oxide exfoliated into layers through the exfoliation is dispersible in a dispersion medium. The exfoliation can be performed after mixing the carbon material composite purified in the purifying and a dispersion medium.

When the purifying is performed between the first mixing and the second mixing, the exfoliation may be performed after the purifying and before the second mixing. It is preferably performed after the second mixing (after the completion of the mixing).

For the composite according to the first aspect of the present invention containing a nonionic surfactant as a single surfactant and graphite oxide, the dispersion medium may be either an organic dispersion medium or an aqueous dispersion medium containing water. Preferred examples of the dispersion medium include carbonate esters such as ethylene carbonate and propylene carbonate; lactams such as N-methyl-1-pyrrolidone; amides such as dimethylformamide and dimethylacetamide; ethers such as tetrahydrofuran and diethyl ether; lactones such as γ-butyrolactone; alcohols such as methanol, ethanol, propanol, and diacetone alcohol; ketones such as acetone, methyl ethyl ketone, and methyl isobutyl ketone; esters such as methyl acetate, ethyl acetate, and butyl acetate; and water. Each of these may be use alone or two or more of these may be used as a dispersion medium mixture. More preferred are carbonate esters, lactams, amides, ethers, lactones, alcohols, and water. Still more preferred are propylene carbonate, N-methyl-1-pyrrolidone, dimethylformamide, dimethylacetamide, tetrahydrofuran, γ-butyrolactone, diacetone alcohol, and water, with γ-butyrolactone, diacetone alcohol, and water being particularly preferred. In other words, an aqueous dispersion medium is preferred.

Since sulfuric acid can be sufficiently removed through the purification and the action of the nonionic surfactant on the graphite oxide is not too strong and is moderate, the graphite oxide can be very suitably exfoliated into layers in the exfoliation. As a result, the carbon material composite can be dispersed in a dispersion medium.

The dispersion medium is also preferably a liquid polymer compound. Examples of the liquid polymer compound include polyethylene glycol, polypropylene glycol, and silicone oil. One or two or more of these may be used.

The dispersion medium is also preferably a resin precursor (monomer). The resin precursor may be a hydrophilic (aqueous) resin precursor or a lipophilic (organic) resin precursor. As the resin precursor, a precursor of conventionally known thermoplastic resin, thermosetting resin, or photocurable resin, or a different precursor may be appropriately used.

Examples of the thermoplastic resin include olefin resins such as polyethylene, polypropylene, ethylene-olefin copolymers (e.g., an ethylene-propylene copolymer), and polymethylpentene; (meth)acrylic resins such as poly(meth)acrylate resin, poly(meth)acrylic acid resin, and poly(meth)acrylonitrile resin; styrene-based resins such as polystyrene, AS resin (acrylonitrile-styrene resin), ABS resin (acrylonitrile-butadiene-styrene resin), ACS resin (chlorinated polyethylene-acrylonitrile-styrene resin), and AES resin (acrylonitrile-ethylene-styrene resin); vinyl halide resins such as polyvinyl chloride, polyvinylidene chloride, and polyvinylidene fluoride; amide resins such as aliphatic polyamide and aromatic polyamide; vinyl acetate resins such as polyvinyl acetate and ethylene-vinyl acetate copolymers; other vinyl resins such as poly(vinyl alcohol) resin, polyvinyl acetal resin, polyvinyl ether resin, and polyvinyl ketone resin; polyester resins such as polyethylene terephthalate, polybutylene terephthalate, and polyethylene naphthalate; phenylene group-containing resins such as PPE resin (polyphenylene ether resin), modified PPE resin, polyphenylene oxide, and polyphenylene sulfide; fluororesins such as polytetrafluoroethylene; polyether resins such as polyether ether ketone, polyether ketone, polyethersulfone, and polyether nitrile; polycarbonate; silicone resin; polysulfone resin; liquid crystal polymers; and copolymer obtained by appropriately combining monomers used for obtaining these resins.

Examples of the thermosetting resin include epoxy resin, phenol resin, cyanic ester resin, melamine resin, polyimide resin, bismaleimide resin, urea resin, alkyd resin, silicone resin, vinyl ester resin, benzoxazine resin, and urethane resin.

Examples of the photocurable resin include photocurable (meth)acrylic resins such as urethane (meth)acrylic resin and epoxy (meth)acrylic resin; and polyvinyl carbonate resins such as polyvinyl acetate resin.

The resin precursor may be a monomer used to obtain the above-described resin (e.g., the thermoplastic resin, thermosetting resin, or photocurable resin). In particular, it is preferably a monomer containing an ethylenically unsaturated double bond (vinyl monomer) or an epoxy compound (epoxy monomer).

The monomer containing an ethylenically unsaturated double bond may be monofunctional or polyfunctional. Examples thereof include (meth)acrylic monomers such as (meth)acrylic acid ester, (meth)acrylic acid, and (meth)acrylonitrile; styrene-based monomers such as styrene and divinylbenzene; and other vinyl monomers such as vinyl acetate, vinyl chloride, vinyl ether, and butadiene. One or two or more of these may be used.

Examples of the epoxy compound include an alicyclic epoxy compound, an aromatic epoxy compound, and a hydrogenated epoxy compound. One or two or more of these may be used.

The dispersion medium may be a dispersion medium mixture containing at least two selected from the group consisting of water, an organic dispersion medium, a liquid polymer compound, and a resin precursor.

For example, the dispersion medium may be an aqueous dispersion medium or organic dispersion medium in which the above-described liquid polymer compound or resin precursor is dissolved or dispersed.

The dispersion medium may contain resin. For example, the dispersion medium may contain water and/or an organic dispersion medium and the above-described resin dissolved or dispersed therein. Examples of the resin include the above-described thermoplastic resin, thermosetting resin, and photocurable resin. One or two or more of these may be used. For example, the dispersion medium may suitably be one in which a water-soluble resin is dissolved in water, one in which emulsion particles are dispersed in water, or one in which a polymer such as vinyl resin is dissolved in an organic dispersion medium.

The organic dispersion medium is preferably a preferred organic dispersion medium in the exfoliation according to the first aspect of the present invention.

In summary, the dispersion medium may be one selected from the group consisting of water, an organic dispersion medium, a liquid polymer compound, resin, and a resin precursor or a dispersion medium mixture containing two or more of these.

As described above, preferred examples of a resin-based dispersion medium containing resin and/or a resin precursor as the dispersion medium include an epoxy compound (epoxy monomer), an epoxy resin, a monomer containing an ethylenically unsaturated double bond (vinyl monomer), a vinyl resin, a copolymer obtained from a combination of two or more of these monomers, and a dispersion medium mixture containing two or more of these. The resin-based dispersion medium may further contain an organic dispersion medium and/or water.

The following describes the dispersion medium used in the exfoliation in the method of producing a carbon material composite according to the second aspect of the present invention. For the composite containing a cationic surfactant as a single surfactant and graphite oxide, the dispersion medium may be an organic dispersion medium (optionally containing water). Preferred examples of the organic dispersion medium include propylene carbonate, N-methyl-1-pyrrolidone, dimethylformamide, dimethylacetamide, tetrahydrofuran, γ-butyrolactone, and diacetone alcohol. Particularly preferred are propylene carbonate and γ-butyrolactone. Each of these may be used alone or two or more of these may be used as a dispersion medium mixture. In a preferred embodiment of the present invention, when the dispersion medium contains one of these dispersion media or two or more of these as a dispersion medium mixture, even a non-polar dispersion medium such as toluene or hexane other than the above preferred dispersion media may be appropriately mixed, for example. For the composite containing a cationic surfactant, a nonionic surfactant, and graphite oxide, the dispersion medium may be an organic dispersion medium or an aqueous dispersion medium containing water. Preferred examples thereof include propylene carbonate, N-methyl-1-pyrrolidone, dimethylformamide, dimethylacetamide, tetrahydrofuran, γ-butyrolactone, diacetone alcohol, and water. Particularly preferred are propylene carbonate, γ-butyrolactone, and water. Each of these may be used alone or two or more of these may be used as a dispersion medium mixture. In a preferred embodiment of the present invention, when the dispersion medium contains one of these dispersion media or two or more of these as a dispersion medium mixture, even a non-polar dispersion medium such as toluene or hexane other than the above preferred dispersion media may be appropriately mixed, for example.

Since sulfuric acid can be sufficiently removed through the purification; the graphite oxide having a surface to which a cationic surfactant is bonded suitably interacts with an organic dispersion medium; and the graphite oxide having a surface to which a cationic surfactant and a nonionic surfactant are bonded suitably interacts with both of an aqueous dispersion medium and an organic dispersion medium, the graphite oxide can be very suitably exfoliated into layers in the exfoliation. Thus, the carbon material composite can be dispersed in a dispersion medium.

For the composite according to the second aspect of the present invention containing a cationic surfactant as a single surfactant and graphite oxide, the dispersion medium suitably used in the exfoliation is water, an organic dispersion medium, the above-described liquid polymer compound, resin, or resin precursor. Preferred liquid polymer compounds, resins, and resin precursors are the same as those described above.

The dispersion medium may be a dispersion medium mixture containing at least two appropriately selected from the group consisting of water, an organic dispersion medium, a liquid polymer compound, resin, and a resin precursor as described above. Preferred combinations thereof are as described above.

The organic dispersion medium is preferably a preferred organic dispersion medium in the exfoliation according to the second aspect of the present invention.

The following describes the dispersion medium used in the exfoliation in the method of producing a carbon material composite the third aspect of the present invention. For the composite containing an amphoteric surfactant as a single surfactant and graphite oxide, the dispersion medium may be an organic dispersion medium (optionally containing water). Preferred examples of the organic dispersion medium include C1-C3 lower alcohols such as methanol, ethanol, 1-propanol, and 2-propanol, acetone, methyl ethyl ketone (MEK), acetonitrile, diacetone alcohol, acetyl acetone, and tetrahydrofuran. Each of these may be used alone or two or more of these may be used as a dispersion medium mixture. In a preferred embodiment of the present invention, when the dispersion medium contains one of these dispersion media or two or more of these as a dispersion medium mixture, even a non-polar dispersion medium such as toluene or hexane other than the above preferred dispersion media may be appropriately mixed, for example. For the composite containing an amphoteric surfactant, a nonionic surfactant, and graphite oxide, the dispersion medium may be an organic dispersion medium (optionally containing water) or an aqueous dispersion medium containing water. Preferred examples thereof include C1-C3 lower alcohols such as methanol, ethanol, 1-propanol, and 2-propanol, acetone, methyl ethyl ketone, acetonitrile, diacetone alcohol, acetyl acetone, tetrahydrofuran, and water. Each of these may be used alone or two or more of these may be used as a dispersion medium mixture. In a preferred embodiment of the present invention, when the dispersion medium contains each of these dispersion media or two or more of these as a dispersion medium mixture, even a non-polar dispersion medium such as toluene or hexane other than the above preferred dispersion media may be appropriately mixed, for example. For the composite containing an amphoteric surfactant, a cationic surfactant, and graphite oxide, the dispersion medium may be an organic dispersion medium (optionally containing water) or an aqueous dispersion medium containing water. Preferred examples thereof include acetone, methyl ethyl ketone, methyl isobutyl ketone, acetonitrile, diacetone alcohol, acetyl acetone, tetrahydrofuran, propylene carbonate, and C4-C12 aliphatic alcohols such as butanol, pentanol, and hexanol. Each of these may be used alone or two or more of these may be used as a dispersion medium mixture. In a preferred embodiment of the present invention, when the dispersion medium contains each of these dispersion media or two or more of these as a dispersion medium mixture, even a non-polar dispersion medium such as toluene or hexane other than the above preferred dispersion media may be appropriately mixed, for example. For the composite containing an amphoteric surfactant, a nonionic surfactant, a cationic surfactant, and graphite oxide, the dispersion medium may be an organic dispersion medium (optionally containing water) or an aqueous dispersion medium containing water. Preferred examples thereof include acetone, methyl ethyl ketone, methyl isobutyl ketone, acetonitrile, diacetone alcohol, acetyl acetone, tetrahydrofuran, propylene carbonate, C4-C12 aliphatic alcohols such as butanol, pentanol, and hexanol, acyclic ester solvents such as methyl acetate, ethyl acetate, and butyl acetate, and glycol derivatives such as glycol ether and glycol ester. Each of these may be used alone or two or more of these may be used as a dispersion medium mixture. In a preferred embodiment of the present invention, when the dispersion medium contains each of these dispersion media or two or more of these as a dispersion medium mixture, even a non-polar dispersion medium such as toluene or hexane other than the above preferred dispersion media may be appropriately mixed, for example.

Since sulfuric acid can be sufficiently removed through the purification; the graphite oxide having a surface to which an amphoteric surfactant is bonded suitably interacts with an organic dispersion medium; and the graphite oxide having a surface to which an amphoteric surfactant and a nonionic surfactant and/or a cationic surfactant are bonded suitably interacts with both of an aqueous dispersion medium and an organic dispersion medium, the graphite oxide can be very suitably exfoliated into layers in the exfoliation. Thus, the carbon material composite can be dispersed in a dispersion medium.

For the composite according to the third aspect of the present invention containing an amphoteric surfactant as a single surfactant and graphite oxide, the dispersion medium suitably used in the exfoliation is water, an organic dispersion medium, the above-described liquid polymer compound, resin, or resin precursor. Preferred liquid polymer compounds, resins, and resin precursors are the same as those described above.

The dispersion medium may be a dispersion medium mixture containing at least two appropriately selected from the group consisting of water, an organic dispersion medium, a liquid polymer compound, resin, and resin precursor as described above. Preferred combinations thereof are as described above.

The organic dispersion medium is preferably a preferred organic dispersion medium in the exfoliation according to the third aspect of the present invention.

In the method of producing a carbon material composite of the present invention, the amount of sulfuric acid in the dispersion medium in the exfoliation is preferably 0.1% by mass or less relative to 100% by mass of the dispersion medium, for example.

The exfoliation may be performed, for example, in the air or in an inert gas atmosphere, such as in a nitrogen, helium, or argon atmosphere. The exfoliation may be performed under any temperature conditions. For example, it is preferably performed within the range of 10° C. to 50° C. The exfoliation may be performed under any pressure conditions such as increased pressure, atmospheric pressure, or reduced pressure conditions. For example, it is preferably performed under atmospheric pressure conditions.

The duration of the exfoliation may be appropriately controlled depending on the whole amount of the carbon material composite dispersion and the size of an exfoliation apparatus. For example, it is preferably 1 minute to 120 hours.

(Oxidation of Graphite)

In the method of producing a carbon material composite of the present invention, the oxidation of graphite may be performed by any technique that can oxidize graphite. The oxidation of graphite may be performed by any of the Hummers method, the Brodie method, and the Staudenmaier method described above. It may be oxidation by the Hummers method in which a permanganate is added to a liquid mixture containing graphite and sulfuric acid.

In the above-described techniques of oxidizing graphite, the oxidation usually uses an acid to oxidize graphite.

In the production method of the present invention, acids remain in the aqueous dispersion to be subjected to the purification. Still, an unexpected effect is expressed that even in the presence of such residual acids, the graphite oxide interacts with at least one surfactant selected from the group consisting of a nonionic surfactant, a cationic surfactant, and an amphoteric surfactant so that they aggregate together, and impurities such as acids can be easily removed. Thus, a high-quality carbon material composite can be simply produced.

In particular, in a preferred embodiment of the present invention, the oxidation includes adding a permanganate to a liquid mixture containing graphite and sulfuric acid.

In the oxidation, the amount of the sulfuric acid used is preferably such that the mass ratio of sulfuric acid to graphite (sulfuric acid/graphite) is 25 to 60. With a mass ratio of 25 or more, an increase in viscosity of the reaction composition (liquid mixture) can be sufficiently prevented during the oxidation reaction, leading to efficient production of graphite oxide. Meanwhile, with a mass ratio of 60 or less, the amount of liquid waste can be sufficiently reduced.

The graphite used in the oxidation preferably has an average particle size of 3 μm or greater and 80 μm or smaller. With such an average particle size, the oxidation reaction can be more efficiently promoted. The graphite more preferably has an average particle size of 3.2 μm or greater and 70 μm or smaller.

The average particle size is preferably an average particle size on a volume basis determined with a laser diffraction/scattering particle size distribution analyzer.

The graphite used in the oxidation may be in any form, such as in the form of fine powder, powder, grains, granules, flakes, polyhedrons, rods, or particles with a curved surface. The particles with an average particle size falling within the above range can be produced by, for example, pulverizing particles with a pulverizer or the like; sorting particles by size with a sieve or the like; a combination of these; or a method in which the preparation conditions of the production of particles are optimized to prepare particles with a desired particle size.

The amount of the graphite in the liquid mixture containing graphite and sulfuric acid is preferably 0.5% by mass or more, more preferably 1% by mass or more, still more preferably 1.5% by mass or more, particularly preferably 2% by mass or more relative to 100% by mass of the liquid mixture. The amount of the graphite is preferably 10% by mass or less, more preferably 8% by mass or less, still more preferably 7% by mass or less, particularly preferably 6% by mass or less.

In the oxidation in the production method of the present invention, one type of graphite may be used alone, or two or more types of graphite different in average particle size, form, or the like may be used.

When the oxidation includes adding a permanganate to the liquid mixture containing graphite and sulfuric acid, the permanganate added in the oxidation may be, for example, sodium permanganate, potassium permanganate, ammonium permanganate, silver permanganate, zinc permanganate, magnesium permanganate, calcium permanganate, or barium permanganate. One or two or more of these may be used. Preferred among these are sodium permanganate and potassium permanganate, with potassium permanganate being more preferred.

When the oxidation includes adding a permanganate to the liquid mixture containing graphite and sulfuric acid, the whole amount of the permanganate added in the oxidation is preferably 50 to 500% by mass relative to 100% by mass of the graphite in the liquid mixture. Thus, the graphite oxide can be safely and efficiently produced. The amount of oxygen atoms introduced in the graphite oxide can be controlled by varying the whole amount of the oxidant added.

When the oxidation includes adding a permanganate to the liquid mixture containing graphite and sulfuric acid, the permanganate may be added at once, in multiple portions, or continuously in the oxidation, preferably added in multiple portions or continuously. Thereby, the oxidation reaction is prevented from proceeding rapidly, so that the reaction is more easily controlled.

When the permanganate is added in multiple portions, the amounts of the respective portions may be the same as or different from each other.

When the oxidation includes adding a permanganate to the liquid mixture containing graphite and sulfuric acid, the permanganate is preferably added while the temperature of the liquid mixture is maintained within the range of 10° C. to 50° C. in the oxidation. At a temperature maintained within the above range, the oxidation reaction can sufficiently proceed under control.

When the oxidation includes adding a permanganate to the liquid mixture containing graphite and sulfuric acid, the oxidation preferably includes adding a permanganate while maintaining the temperature variation of the liquid mixture within 30° C. Thus, the oxidation can be performed more stably.

When the oxidation includes adding a permanganate to the liquid mixture containing graphite and sulfuric acid, to stably perform the oxidation, the permanganate is preferably added from 10 minutes to 10 hours in the oxidation.

The oxidation is preferably performed under stirring using, for example, a known stirrer.

The oxidation may be performed, for example, in the air or in an inert gas atmosphere, such as in a nitrogen, helium, or argon atmosphere. The oxidation may be performed under any pressure conditions such as increased pressure, atmospheric pressure, or reduced pressure conditions. For example, it is preferably performed under atmospheric pressure conditions.

The oxidation may be performed continuously or intermittently.

The liquid mixture can be obtained by mixing graphite, sulfuric acid, and an optional different component. The mixing can be appropriately performed by a known technique. For example, the graphite is preferably homogeneously dispersed by ultrasonication or using a known disperser.

The method of producing a carbon material composite of the present invention may further include different steps such as aging, oxidation reaction termination, and concentration between the oxidation of graphite and the purification. As described above, for example, preferably, a liquid obtained by adding water and/or hydrogen peroxide water to the reaction composition during the oxidation reaction termination is used as an aqueous dispersion in the purification.

In the aging, the temperature and duration of aging the reaction composition obtained through the oxidation may be appropriately selected. The temperature of the reaction composition is preferably maintained at 0° C. to 90° C.

The duration of aging is preferably 0.1 to 24 hours.

The oxidation reaction termination may be performed in the air or in an inert gas atmosphere, such as in a nitrogen, helium, or argon atmosphere. It may be performed also in a vacuum.

The oxidation reaction termination may be performed by, for example, setting the temperature of the reaction composition at 5° C. to 15° C. and adding water and then a hydrogen peroxide solution as a reducing agent or adding only a hydrogen peroxide solution to the reaction composition. Alternatively, the reaction composition may be added to water or a hydrogen peroxide solution having a temperature of 5° C. to 25° C.

The duration of the oxidation reaction termination may be, for example, 0.01 to 5 hours.

The concentration enables appropriate removal of acids or water from the reaction composition. Thereby, the amount of acids or water can be controlled to fall within a suitable range. This step may be performed by centrifugation, redispersion with addition of water, filtration, vacuum concentration, or another technique. Each technique may be repeated, but is preferably completed in one cycle without repetition.

The production method of the present invention may further include, after the purification, reacting the graphite oxide in the carbon material composite purified in the purification and a compound reactive with the oxygen-containing functional groups of the graphite oxide to produce a graphite oxide derivative.

The compound reactive with the oxygen-containing functional groups of the graphite oxide preferably contains, for example, at least one selected from the group consisting of alcohols, silane compounds, fatty acids (salts), fatty acid esters, isocyanate compounds, and amines. The silane compounds preferably have a siloxy group and/or an alkoxy group directly bonding to a silicon atom because such silane compounds have good reactivity to the oxygen-containing functional groups of the graphite oxide.

<Carbon Material Composite>

The present invention also relates to a carbon material composite including graphite oxide, the carbon material composite further containing a nonionic surfactant and the graphite oxide having a ratio of the number of carbon atoms to the number of oxygen atoms (C/O) of 5.5 or lower; or the carbon material composite further containing a nonionic surfactant and a cationic surfactant, or further . . . containing a nonionic surfactant and/or a cationic surfactant and an amphoteric surfactant.

In the first aspect of the present invention, the carbon material composite contains at least a nonionic surfactant and graphite oxide. The carbon material composite according to the first aspect of the present invention can be suitably dispersed in a dispersion medium. In a preferred embodiment of the carbon material composite according to the first aspect of the present invention, the carbon material composite contains a nonionic surfactant and graphite oxide having a ratio of the number of carbon atoms to the number of oxygen atoms (C/O) of 5.5 or lower. The carbon material composite can be more sufficiently dispersed in a dispersion medium.

The ratio is preferably 5 or lower, more preferably 4 or lower, and preferably 1 or higher.

The ratio of the number of carbon atoms to the number of oxygen atoms can be determined from the ratio between the total peak area in the O1s region and the total peak area in the C1s region determined by XPS measurement.

The carbon material composite according to the first aspect of the present invention can be produced by the method of producing a carbon material composite according to the first aspect of the present invention.

In the second aspect of the present invention, the carbon material composite contains at least a cationic surfactant and graphite oxide. The carbon material composite according to the second aspect of the present invention can be suitably dispersed in an organic dispersion medium. In a preferred embodiment of the carbon material composite according to the second aspect of the present invention, the carbon material composite contains a nonionic surfactant, a cationic surfactant, and graphite oxide. In another preferred embodiment of the carbon material composite according to the second aspect of the present invention, the carbon material composite contains graphite oxide and a cationic surfactant having a cationizable group and a hydrophilic group with a lower polarity than the cationizable group. These carbon material composites can be suitably dispersed in both of an aqueous dispersion medium and an organic dispersion medium.

The carbon material composite according to the second aspect of the present invention can be produced by the method of producing a carbon material composite according to the second aspect of the present invention.

In the third aspect of the present invention, the carbon material composite contains an amphoteric surfactant and graphite oxide. The carbon material composite according to the third aspect of the present invention can be suitably dispersed in an organic dispersion medium. In a preferred embodiment of the carbon material composite according to the third aspect of the present invention, the carbon material composite contains a nonionic surfactant and/or a cationic surfactant, an amphoteric surfactant, and graphite oxide. In another preferred embodiment of the carbon material composite according to the third aspect of the present invention, the carbon material composite contains graphite oxide and an amphoteric surfactant having a cationizable group, an anionizable group, and a hydrophilic group with a lower polarity than the cationizable group or the anionizable group. These carbon material composites can be suitably dispersed in both of an aqueous dispersion medium and an organic dispersion medium.

The carbon material composite according to the third aspect of the present invention can be produced by the method of producing a carbon material composite according to the third aspect of the present invention.

In the second and third aspects of the present invention, the graphite oxide preferably has a ratio of the number of carbon atoms to the number of oxygen atoms (C/O) of 5.5 or lower. The ratio is preferably 5 or lower, more preferably 4 or lower. It is preferably 1 or higher.

The ratio of the number of carbon atoms to the number of oxygen atoms can be determined from the ratio between the total peak area in the O1s region and the total peak area in the C1s region determined by XPS measurement.

<Dispersion>

The present invention also relates to a dispersion containing the carbon material composite of the present invention dispersed in a dispersion medium.

The dispersion medium for dispersing the carbon material composite according to the first aspect of the present invention (carbon material composite containing a nonionic surfactant and graphite oxide having a ratio of the number of carbon atoms to the number of oxygen atoms (C/O) of 5.5 or lower) may be either an aqueous dispersion medium or an organic dispersion medium, suitably water or any of the organic dispersion media described for the exfoliation. Examples thereof include propylene carbonate, N-methyl-1-pyrrolidone, dimethylformamide, dimethylacetamide, tetrahydrofuran, γ-butyrolactone, diacetone alcohol, and water. More preferred are γ-butyrolactone, diacetone alcohol, and water. Each of these dispersion media may be used alone or two or more of these may be used as a dispersion medium mixture.

The dispersion medium may suitably be water, an organic dispersion medium, the above-described liquid polymer compound, resin, or resin precursor. The liquid polymer compound, resin, and resin precursor may be those described for the exfoliation, and preferred liquid polymer compound, resin, and resin precursor are the same as those described for the exfoliation.

Suitable examples of the liquid polymer compound include polyethylene glycol and polypropylene glycol.

Suitable examples of the resin include vinyl resin such as (meth)acrylic resin and epoxy resin.

Suitable examples of the resin precursor include vinyl monomers such as a (meth)acrylic monomer and epoxy monomers.

The dispersion medium may be a dispersion medium mixture containing at least two appropriately selected from the group consisting of water, an organic dispersion medium, a liquid polymer compound, resin, and resin precursor. Preferred combinations are the same as those described for the exfoliation.

The organic dispersion medium is preferably a preferred organic dispersion medium in the exfoliation according to the first aspect of the present invention.

The dispersion medium for dispersing the carbon material composite containing a cationic surfactant, a nonionic surfactant, and graphite oxide among the carbon material composites of the second aspect of the present invention may be either an aqueous dispersion medium or an organic dispersion medium. Preferred examples thereof include propylene carbonate, N-methyl-1-pyrrolidone, dimethylformamide, dimethylacetamide, tetrahydrofuran, γ-butyrolactone, diacetone alcohol, and water. Particularly preferred are propylene carbonate, γ-butyrolactone, and water. The dispersion medium for dispersing the composite containing a cationic surfactant as a single surfactant and graphite oxide may be an organic dispersion medium (optionally containing water). Preferred examples of the organic dispersion medium include propylene carbonate, N-methyl-1-pyrrolidone, dimethylformamide, dimethylacetamide, tetrahydrofuran, γ-butyrolactone, and diacetone alcohol. Particularly preferred are propylene carbonate and γ-butyrolactone. Each of these dispersion media may be used alone or two or more of these may be used as a dispersion medium mixture.

The dispersion medium may suitably be an aqueous dispersion medium, an organic dispersion medium, the above-described liquid polymer compound, resin, or resin precursor. The liquid polymer compound, resin, and resin precursor may be those described for the exfoliation, and preferred liquid polymer compound, resin, and resin precursor are the same as those described for the exfoliation.

The dispersion medium may be a dispersion medium mixture containing at least two appropriately selected from the group consisting of water, an organic dispersion medium, a liquid polymer compound, resin, and resin precursor. Preferred combinations are the same as those described for the exfoliation.

The organic dispersion medium is preferably a preferred organic dispersion medium in the exfoliation according to the second aspect of the present invention.

The dispersion medium for dispersing the composite containing an amphoteric surfactant and a nonionic surfactant and/or a cationic surfactant and graphite oxide among the carbon material composites of the third aspect of the present invention may be either an aqueous dispersion medium or an organic dispersion medium (optionally containing water). Examples thereof include C1-C3 lower alcohols such as methanol, ethanol, 1-propanol, and 2-propanol; C4-C12 aliphatic alcohols such as butanol, pentanol, and hexanol; acetone; methyl ethyl ketone (MEK); acetonitrile; diacetone alcohol; acetyl acetone; tetrahydrofuran; propylene carbonate; and acyclic ester solvents such as methyl acetate, ethyl acetate, and butyl acetate. The dispersion medium for dispersing the composite containing an amphoteric surfactant as a single surfactant and graphite oxide may be a relatively highly polar organic dispersion medium (optionally containing water). Preferred examples of the relatively highly polar organic dispersion medium include C1-C3 lower alcohols such as methanol, ethanol, 1-propanol, and 2-propanol, acetone, methyl ethyl ketone, acetonitrile, diacetone alcohol, and acetyl acetone.

Each of these dispersion media may be used alone or two or more of these may be used as a dispersion medium mixture.

The dispersion medium may suitably be an aqueous dispersion medium, an organic dispersion medium, the above-described liquid polymer compound, resin, or resin precursor. The liquid polymer compound, resin, and resin precursor may be those described for the exfoliation, and preferred liquid polymer compound, resin, and resin precursor are the same as those described for the exfoliation.

The dispersion medium may be a dispersion medium mixture containing at least two appropriately selected from the group consisting of water, an organic dispersion medium, a liquid polymer compound, resin, and resin precursor. Preferred combinations are the same as those described for the exfoliation.

The organic dispersion medium is preferably a preferred organic dispersion medium in the exfoliation according to the third aspect of the present invention.

The proportion of the carbon material composite of the present invention in the dispersion of the present invention can be appropriately controlled.

As described above, the dispersion of the present invention may be one containing the carbon material composite of the present invention dispersed in a resin and/or a resin precursor (resin-based dispersion). The resin-based dispersion may further contain at least one dispersion medium selected from the group consisting of water, an organic dispersion medium, and a liquid polymer compound.

The resin-based dispersion may be in the form of a liquid or gel composition or in the form of a solid (e.g., molded body).

The resin-based dispersion may be prepared, for example, by kneading the above-described resin (thermoplastic resin, thermosetting resin, or photocurable resin) (which is preferably melted before kneading) with: a dispersion containing the carbon material composite of the present invention dispersed in an aqueous dispersion medium or an organic dispersion medium; or the carbon material composite of the present invention itself (powder).

The molded body may be prepared, for example, using the resin-based dispersion of the present invention in the form of a liquid or gel composition. For example, it can be prepared by applying the composition to be formed into a film, by molding the composition, or by polymerizing or curing the resin precursor in the composition.

For example, the resin-based dispersion of the present invention may be in the form of a liquid or gel composition or may be in the form of a solid such as a film, a sheet, fibers, pellets, or particles.

The film may be a coating film, a self-supported film, or the like.

<Method of Producing Graphite Oxide>

The present invention relates to a method of producing graphite oxide including: oxidizing graphite; mixing an aqueous dispersion obtained through the oxidizing, the aqueous dispersion containing graphite oxide dispersed therein, and at least one surfactant selected from the group consisting of a nonionic surfactant, a cationic surfactant, and an amphoteric surfactant; and purifying the graphite oxide.

In a preferred embodiment of the method of producing graphite oxide of the present invention, the purification is a step of purifying the graphite oxide by at least one technique selected from the group consisting of filtration, decantation, centrifugation, and solvent extraction.

The method of producing graphite oxide of the present invention may be the same as the above-described method of producing a carbon material composite of the present invention. For example, the graphite oxide can be obtained by removing impurities and the surfactants used (the surfactants described above) by repeating the above-described specific purification or by repeating washing with water after the purification. To remove the surfactants, the washing with water free from surfactants is preferably performed. The method of producing graphite oxide of the present invention can simply produce high-quality graphite oxide.

For example, the purification of graphite oxide can be also referred to as a step of removing surfactants so that substantially no surfactant remains.

The state where substantially no surfactant remains refers to, for example, that the proportion by mass of the surfactants is 1000 ppm or less.

The carbon material composite obtained by the method of producing a carbon material composite of the present invention, the carbon material composite of the present invention, the dispersion of the present invention, and the graphite oxide obtained by the method of producing graphite oxide of the present invention are all suitable for catalysts, electrode active substances for cells and capacitors, thermoelectric conversion materials, conductive materials, light-emitting materials, lubricant additives, additives for polymers, permeable membrane materials, antimicrobial materials, water-repellent materials, and adsorption materials.

The carbon material composite and graphite oxide obtained by the production method of the first aspect of the present invention are suitably dispersed in an aqueous dispersion medium. Thus, they are particularly suitable for applications where water or moisture may be present among the above applications.

The carbon material composite and graphite oxide obtained by the production method of the second aspect of the present invention are suitably dispersed in an organic dispersion medium. Thus, they are particularly suitable for applications where the presence of water or moisture is undesirable among the above applications.

The carbon material composite and graphite oxide obtained by the production method of the third aspect of the present invention are suitably dispersed in an organic dispersion medium. Thus, they are particularly suitable for applications where the presence of water or moisture is undesirable among the above applications.

Examples of the cells include lithium ion secondary cells, polymer electrolyte fuel cells, and metal-air cells.

Examples of thermoelectric conversion apparatus using the thermoelectric conversion materials include: generators such as geothermal/hot spring geothermal generators, solar thermoelectric generators, waste heat generators for factories, vehicles, or the like, and human body thermoelectric generators; and various electric products, electric motors, and satellites equipped with any of these generators as at least one power source.

EXAMPLES

The present invention is described based on examples in more detail below. They are, however, by no means limitative of the scope of the invention. Unless otherwise mentioned, the term "part(s)" means "part(s) by mass" and "%" means "% by mass".

Synthesis of Graphite Oxide-Containing Aqueous Dispersion

Synthesis Example

Graphite oxide was synthesized in the following steps. A reaction vessel was charged with 15 g of graphite (Z-25 available from Ito Graphite Co., Ltd.) and 640 g of sulfuric acid (Wako Pure Chemical Industries, Ltd.) in advance. To the vessel was added 45 g of potassium permanganate (Wako Pure Chemical Industries, Ltd.) while the temperature was controlled at 30° C. After the addition, the contents were warmed to 35° C. over 30 minutes and allowed to react for two hours. After the reaction, to the reaction solution were added 1070 mL of water and 42 mL of 30% hydrogen peroxide water (Wako Pure Chemical Industries, Ltd.), so that the reaction was terminated. Thus, a graphite oxide-containing aqueous dispersion (total mass of water: 1812 g, concentration in terms of the raw graphite: 0.83%, water concentration: 61%, sulfate ion concentration: 36%) was obtained. The graphite oxide in the graphite oxide-containing aqueous dispersion had a C/O ratio of 1.8.

1. Examples According to the First Aspect of the Present Invention

<Evaluation of Purification Efficiency>

Example 1-1

To the graphite oxide-containing aqueous dispersion (100 g) obtained in the synthesis example was added SOFTANOL 120 (Nippon Shokubai Co., Ltd.) in an amount of 0.75 mass equivalents per raw graphite, so that aggregates were produced. The contents were stirred and then filtered. The filterability was very good (the filtration was completed within 10 minutes). To the wet cake resulting from the filtration was added water, and then they were filtered and washed with water. The filterability was well maintained (the filtration was completed within 10 minutes). The washing with water was carried out twice, with good filterability being maintained in both times.

Example 1-2

The filterability was examined as in Example 1-1 except that SOFTANOL 50 (Nippon Shokubai Co., Ltd.) was used as a nonionic surfactant instead of SOFTANOL 120 (Nippon Shokubai Co., Ltd.) used in an amount of 0.75 mass equivalents per raw graphite. The mass equivalent of SOFTANOL 50 was the same as that of SOFTANOL 120. The filterability was good.

Example 1-3

The filterability was examined as in Example 1-1 except that NEWCOL 85 (Nippon Nyukazai Co., Ltd.) was used as a nonionic surfactant instead of SOFTANOL 120 (Nippon Shokubai Co., Ltd.) used in an amount of 0.75 mass equivalents per raw graphite. The mass equivalent of NEWCOL 85 was the same as that of SOFTANOL 120. The filterability was good.

Comparative Example 1-1

As an example without an aggregating agent, the filterability was examined as in Example 1-1 except that no nonionic surfactant (SOFTANOL 120) was added. The filterability was very poor, the filter paper was clogged, and the filtration was not achieved.

Comparative Example 1-2

As an example of using an anionic surfactant instead of a nonionic surfactant, the filterability was examined as in Example 1-1 except that sodium linear-dodecylbenzene-sulfonate (Wako Pure Chemical Industries, Ltd.) was used instead of SOFTANOL 120 (Nippon Shokubai Co., Ltd.) used in an amount of 0.75 mass equivalents per raw graphite. The mass equivalent of sodium linear-dodecylbenzene-sulfonate was the same as that of SOFTANOL 120. The filterability was very poor, the filter paper was clogged, and the filtration was not achieved.

<Dispersibility of Graphite Oxide Composite>

Example 1-4

To the graphite oxide composite-containing wet cake (in an amount corresponding to 1 g of the raw graphite) obtained in Example 1-1 was added 100 g of water. The contents were stirred and then sonicated for 30 minutes. Thus, an aqueous graphite oxide composite dispersion was prepared. The aqueous dispersion was allowed to stand for 24 hours. The aqueous dispersion showed no phase separation and maintained uniform appearance, indicating very good dispersibility.

Example 1-5

An aqueous graphite oxide composite dispersion was prepared and allowed to stand for 24 hours as in Example 1-4 except that the graphite oxide composite-containing wet cake obtained in Example 1-2 was used. The aqueous dispersion maintained uniform appearance, indicating very good dispersibility.

Example 1-6

An aqueous graphite oxide composite dispersion was prepared and allowed to stand for 24 hours as in Example 1-4 except that the graphite oxide composite-containing wet cake obtained in Example 1-3 was used. The aqueous dispersion maintained uniform appearance, indicating very good dispersibility.

Example 1-7

A graphite oxide composite dispersion in γ-butyrolactone was prepared and allowed to stand for 24 hours as in Example 1-4 except that γ-butyrolactone was used as a dispersion medium. The dispersion in γ-butyrolactone maintained uniform appearance, indicating very good dispersibility.

Example 1-8

To the aqueous graphite oxide composite dispersion obtained in Example 1-4 was added water so that the percentage of graphite was 0.66% by mass. The contents were sonicated for 30 minutes using a desktop ultrasonic bath (Bransonic (405 W) available from Branson), so that a uniform aqueous graphite oxide composite dispersion was obtained. To the aqueous graphite oxide composite dispersion was added L-ascorbic acid (Wako Pure Chemical Industries, Ltd.) as a reducing agent in an amount of 7.5 mass equivalents per graphite. The reaction was performed at 70° C. for one hour for reduction. After the reaction, the reaction product was filtered and washed with water until the filtrate showed neutral when tested with pH paper. To the resulting graphite oxide composite-containing wet cake (in an amount corresponding to 1 g of the raw graphite) was added 100 g of water. The contents were stirred and then sonicated for 30 minutes. Thus, an aqueous graphite oxide composite dispersion was prepared. The aqueous dispersion was allowed to stand for 24 hours. The dispersion showed no phase separation and maintained uniform appearance, indicating good dispersibility, but some aggregates were produced. The graphite oxide composite obtained in Example 1-8 was further washed to provide graphite oxide. The graphite oxide was analyzed and found to have a C/O ratio of 5.7.

The results of Examples 1-1 to 1-3 and Comparative Examples 1-1 and 1-2 demonstrated that good purification efficiency was achieved by adding a nonionic surfactant before purification. The results of Examples 1-4 to 1-8 demonstrated that the carbon material composites (graphite oxide composites) obtained by any of the above-described purification techniques were each well dispersed in the respective dispersion media. The method of producing a carbon material composite of the present invention can simply produce a high-quality carbon material composite at low cost. The resulting carbon material composites (carbon material composites each containing a nonionic surfactant and graphite oxide) can be dispersed in a dispersion medium very well.

2. Examples According to the Second Aspect of the Present Invention

<Evaluation of Purification Efficiency>

Example 2-1

To the graphite oxide-containing aqueous dispersion (100 g) obtained in the synthesis example was added 1-dodecylpyridinium chloride (Tokyo Chemical Industry Co., Ltd.) in an amount of 0.75 mass equivalents per raw graphite so that aggregates were produced. The contents were stirred and then filtered. The filterability was very good (the filtration was completed within 10 minutes). To the wet cake resulting from the filtration (graphite oxide composite-containing wet cake) was added water, and then, they were filtered and washed with water. The filterability was well maintained (the filtration was completed within 10 minutes). The washing with water was carried out twice, with good filterability being maintained in both times.

Example 2-2

The filterability was examined as in Example 2-1 except that trimethylstearylammonium chloride (Tokyo Chemical Industry Co., Ltd.) was used as a cationic surfactant instead of 1-dodecylpyridinium chloride (Tokyo Chemical Industry Co., Ltd.) used in an amount of 0.75 mass equivalents per raw graphite. The mass equivalent of trimethylstearylammonium chloride was the same as that of 1-dodecylpyridinium chloride. The filterability was good.

Example 2-3

The filterability was examined as in Example 2-1 except that a 10% benzalkonium chloride solution (Wako Pure Chemical Industries, Ltd.) was used in an amount of 7.5 mass equivalents per raw graphite as a cationic surfactant instead of 1-dodecylpyridinium chloride (Tokyo Chemical Industry Co., Ltd.) in an amount of 0.75 mass equivalents. The filterability was good.

Example 2-4

To the graphite oxide-containing aqueous dispersion (100 g) obtained in the synthesis example were added SOFTANOL 120 (Nippon Shokubai Co., Ltd.) and 1-dodecylpyridinium chloride (Tokyo Chemical Industry Co., Ltd.) in amounts of 0.45 mass equivalents and 0.30 mass equivalents per raw graphite, respectively, so that aggregates were produced. The contents were stirred and then filtered. The filterability was very good (the filtration was completed within 10 minutes). To the wet cake resulting from the filtration was added water, and then, they were filtered and washed with water. The filterability was well maintained (the filtration was completed within 10 minutes). The washing with water was carried out twice, with good filterability being maintained in both times.

Example 2-5

The filterability was examined as in Example 2-4 except that trimethylstearylammonium chloride (Tokyo Chemical Industry Co., Ltd.) was used as a cationic surfactant instead of 1-dodecylpyridinium chloride (Tokyo Chemical Industry Co., Ltd.) used in an amount of 0.30 mass equivalents per raw graphite. The mass equivalent of trimethylstearylammonium chloride was the same as that of 1-dodecylpyridinium chloride. The filterability was good.

Example 2-6

The filterability was examined as in Example 2-4 except that NEWCOL 85 (Nippon Nyukazai Co., Ltd.) was used as a nonionic surfactant instead of SOFTANOL 120 (Nippon Shokubai Co., Ltd.) used in an amount of 0.45 mass equivalents per raw graphite. The mass equivalent of NEWCOL 85 was the same as that of SOFTANOL 120. The filterability was good.

Comparative Example 2-1

As an example without an aggregating agent, the filterability was examined as in Example 2-1 except that no cationic surfactant was added. The filterability was very poor, the filter paper was clogged, and the filtration was not achieved.

Comparative Example 2-2

As an example of using an anionic surfactant instead of a cationic surfactant, the filterability was examined as in Example 2-1 except that sodium linear-dodecylbenzenesulfonate (Wako Pure Chemical Industries, Ltd.) was used instead of 1-dodecylpyridinium chloride (Tokyo Chemical Industry Co., Ltd.) used in an amount of 0.75 mass equivalents per raw graphite. The mass equivalent of sodium linear-dodecylbenzenesulfonate was the same as that of 1-dodecylpyridinium chloride. The filterability was very poor, the filter paper was clogged, and the filtration was not achieved.

<Dispersibility of Graphite Oxide Composite>

Example 2-7

To the graphite oxide composite-containing wet cake (in an amount corresponding to 1 g of the raw graphite) obtained in Example 2-1 was added 100 g of diacetone alcohol. The contents were stirred and then sonicated for 30 minutes. Thus, a graphite oxide composite dispersion was prepared. The dispersion was allowed to stand for 24 hours. The dispersion showed no phase separation and maintained uniform appearance, indicating very good dispersibility.

Example 2-8

A dispersion was prepared and allowed to stand for 24 hours as in Example 2-7 except that the graphite oxide composite-containing wet cake obtained in Example 2-2 was used instead the graphite oxide composite-containing wet cake obtained in Example 2-1. The dispersion maintained uniform appearance, indicating very good dispersibility.

Example 2-9

A dispersion was prepared and allowed to stand for 24 hours as in Example 2-7 except that the graphite oxide composite-containing wet cake obtained in Example 2-3 was used instead the graphite oxide composite-containing wet cake obtained in Example 2-1. The dispersion maintained uniform appearance, indicating very good dispersibility.

Example 2-10

A dispersion was prepared and allowed to stand for 24 hours as in Example 2-7 except that the graphite oxide composite-containing wet cake obtained in Example 2-4 was used instead the graphite oxide composite-containing wet cake obtained in Example 2-1. The dispersion maintained uniform appearance, indicating very good dispersibility.

Example 2-11

A dispersion was prepared and allowed to stand for 24 hours as in Example 2-7 except that the graphite oxide composite-containing wet cake obtained in Example 2-5 was used instead the graphite oxide composite-containing wet cake obtained in Example 2-1. The dispersion maintained uniform appearance, indicating very good dispersibility.

Example 2-12

A dispersion was prepared and allowed to stand for 24 hours as in Example 2-7 except that the graphite oxide composite-containing wet cake obtained in Example 2-6 was used instead the graphite oxide composite-containing wet cake obtained in Example 2-1. The dispersion maintained uniform appearance, indicating very good dispersibility.

Example 2-13

A dispersion was prepared and allowed to stand for 24 hours as in Example 2-7 except that γ-butyrolactone was used as a dispersion medium instead of diacetone alcohol. The dispersion maintained uniform appearance, indicating very good dispersibility.

Example 2-14

A dispersion was prepared and allowed to stand for 24 hours as in Example 2-10 except that γ-butyrolactone was used as a dispersion medium instead of diacetone alcohol. The dispersion maintained uniform appearance, indicating very good dispersibility.

Example 2-15

An aqueous graphite oxide composite dispersion was prepared and allowed to stand for 24 hours as in Example 2-10 except that water was used as a dispersion medium instead of diacetone alcohol. The aqueous dispersion maintained uniform appearance, indicating very good dispersibility.

Example 2-16

A graphite oxide composite dispersion was prepared and allowed to stand for 24 hours as in Example 2-10 except that propylene carbonate was used as a dispersion medium instead of diacetone alcohol. The dispersion maintained uniform appearance, indicating very good dispersibility.

Example 2-17

The filterability was examined as in Example 2-1 except that Texnol L7 (Nippon Nyukazai Co., Ltd.) was used instead of 1-dodecylpyridinium chloride (Tokyo Chemical Industry Co., Ltd.). The mass equivalent of Texnol L7 was the same as that of 1-dodecylpyridinium chloride. The filterability was good.

Example 2-18

An aqueous graphite oxide composite dispersion was prepared and allowed to stand for 24 hours as in Example 2-7 except that the graphite oxide composite-containing wet cake obtained in Example 2-17 was used instead the graphite oxide composite-containing wet cake obtained in Example 2-1 and propylene carbonate was used instead of diacetone alcohol. The dispersion maintained uniform appearance, indicating very good dispersibility.

Example 2-19

The dispersion obtained in Example 2-16 was diluted with the liquid epoxy resin jER828US (Mitsubishi Chemical Corporation) ten times to obtain a dispersion. The dispersion had very good dispersibility. Also, the curability of the subsequent molded body was not affected. This indicates that the carbon material composite of the present invention is well dispersed even in monomers.

The results of Examples 2-1 to 2-6 and 2-17 and Comparative Examples 2-1 and 2-2 demonstrated that good purification efficiency was achieved by adding at least a cationic surfactant before purification. The results of Examples 2-7 to 2-16, 2-18, and 2-19 demonstrated that the carbon material composites (graphite oxide composites) obtained by any of the above-described purification techniques were each well dispersed in various organic dispersion media and resin-based dispersion media. In particular, the carbon material composite containing a cationic surfactant, a nonionic surfactant, and graphite oxide and the carbon material composite containing graphite oxide and a cationic surfactant having a cationizable group and a hydrophilic group with a lower polarity than the cationizable group. can be dispersed also in an aqueous dispersion medium very well. The production method of the present invention can simply produce a high-quality carbon material composite at low cost.

3. Examples According to the Third Aspect of the Present Invention

<Evaluation of Purification Efficiency>

Example 3-1

To the graphite oxide-containing aqueous dispersion (100 g) obtained in the synthesis example was added lauryl betaine (Fujifilm Wako Pure Chemical Corporation) in an amount of 0.75 mass equivalents per raw graphite so that aggregates were produced. The contents were stirred and then filtered. The filterability was very good (the filtration was completed within 10 minutes). To the wet cake resulting from the filtration was added water, and then, they were filtered and washed with water. The filterability was well maintained (the filtration was completed within 10 minutes). The washing with water was carried out twice, with good filterability being maintained in both times.

Example 3-2

The filterability was examined as in Example 3-1 except that lauryl dimethylamine oxide (Kao Corporation) was used as an amphoteric surfactant instead of lauryl betaine (Fujifilm Wako Pure Chemical Corporation) used in an amount of 0.75 mass equivalents per raw graphite. The mass equivalent of lauryl dimethylamine oxide was the same as that of lauryl betaine. The filterability was good.

Example 3-3

The filterability was examined as in Example 3-1 except that lauryl sulphobetaine (Tokyo Chemical Industry Co., Ltd.) was used as an amphoteric surfactant instead of lauryl betaine (Fujifilm Wako Pure Chemical Corporation) used in an amount of 0.75 mass equivalents per raw graphite. The mass equivalent of lauryl sulphobetaine was the same as that of lauryl betaine. The filterability was good.

Example 3-4

To the graphite oxide-containing aqueous dispersion (100 g) obtained in the synthesis example were added SOFTANOL 120 (Nippon Shokubai Co., Ltd.) as a nonionic surfactant and lauryl betaine (Fujifilm Wako Pure Chemical Corporation) as an amphoteric surfactant in amounts of 0.45 mass equivalents and 0.30 mass equivalents per raw graphite, respectively, so that aggregates were produced. The contents were stirred and then filtered. The filterability was very good (the filtration was completed within 10 minutes). To the wet cake resulting from the filtration was added water, and then, they were filtered and washed with water. The filterability was well maintained (the filtration was completed within 10 minutes). The washing with water was carried out twice, with good filterability being maintained in both times.

Example 3-5

To the graphite oxide-containing aqueous dispersion (100 g) obtained in the synthesis example were added lauryl pyridinium chloride (Fujifilm Wako Pure Chemical Corporation) as a cationic surfactant and lauryl betaine (Fujifilm Wako Pure Chemical Corporation) as an amphoteric surfactant in amounts of 0.45 mass equivalents and 0.30 mass equivalents per raw graphite, respectively, so that aggregates were produced. The contents were stirred and then filtered. The filterability was very good (the filtration was completed within 10 minutes). To the wet cake resulting from the filtration was added water, and then, they were filtered and washed with water. The filterability was well maintained (the filtration was completed within 10 minutes). The washing with water was carried out twice, with good filterability being maintained in both times.

Example 3-6

To the graphite oxide-containing aqueous dispersion (100 g) obtained in the synthesis example were added SOFTANOL 120 (Nippon Shokubai Co., Ltd.) as a nonionic surfactant, lauryl pyridinium chloride (Fujifilm Wako Pure Chemical Corporation) as a cationic surfactant, and lauryl betaine (Fujifilm Wako Pure Chemical Corporation) as an amphoteric surfactant in amounts of 0.15 mass equivalents, 0.30 mass equivalents, and 0.30 mass equivalents per raw graphite, respectively, so that aggregates were produced. The contents were stirred and then filtered. The filterability was very good (the filtration was completed within 10 minutes). To the wet cake resulting from the filtration was added water, and then, they were filtered and washed with water. The filterability was well maintained (the filtration was completed within 10 minutes). The washing with water was carried out twice, with good filterability being maintained in both times.

Comparative Example 3-1

As an example without an aggregating agent, the filterability was examined as in Example 3-1 except that no amphoteric surfactant (lauryl betaine) was added. The filterability was very poor, the filter paper was clogged, and the filtration was not achieved.

Comparative Example 3-2

As an example of using an anionic surfactant instead of an amphoteric surfactant, the filterability was examined as in Example 3-1 except that sodium linear-dodecylbenzenesulfonate (Wako Pure Chemical Industries, Ltd.) was used instead of lauryl betaine (Fujifilm Wako Pure Chemical Corporation) used in an amount of 0.75 mass equivalents per raw graphite. The mass equivalent of sodium linear-dodecylbenzenesulfonate was the same as that of lauryl betaine. The filterability was very poor, the filter paper was clogged, and the filtration was not achieved.

<Dispersibility of Graphite Oxide Composite>

Example 3-7

To the graphite oxide composite-containing wet cake (in an amount corresponding to 1 g of the raw graphite) obtained in Example 3-1 was added 100 g of acetone. The contents were stirred and then sonicated for 30 minutes. Thus, a graphite oxide composite dispersion in acetone was prepared. The dispersion in acetone was allowed to stand for 24 hours. The dispersion showed no phase separation and maintained uniform appearance, indicating very good dispersibility.

Example 3-8

A graphite oxide composite dispersion in acetone was prepared and allowed to stand for 24 hours as in Example 3-7 except that the graphite oxide composite-containing wet cake obtained in Example 3-2 was used. The dispersion in acetone maintained uniform appearance, indicating very good dispersibility.

Example 3-9

A graphite oxide composite dispersion in acetone was prepared and allowed to stand for 24 hours as in Example 3-7 except that the graphite oxide composite-containing wet cake obtained in Example 3-3 was used. The dispersion in acetone maintained uniform appearance, indicating very good dispersibility.

Example 3-10

A graphite oxide composite dispersion in 2-propanol was prepared and allowed to stand for 24 hours as in Example 3-9 except that 2-propanol was used as a dispersion medium. The dispersion in 2-propanol maintained uniform appearance, indicating very good dispersibility.

Example 3-11

A graphite oxide composite dispersion in methanol was prepared and allowed to stand for 24 hours as in Example 3-9 except that methanol was used as a dispersion medium. The dispersion in methanol maintained uniform appearance, indicating good dispersibility.

Example 3-12

A graphite oxide composite dispersion in acetone was prepared and allowed to stand for 24 hours as in Example 3-7 except that the graphite oxide composite-containing wet cake obtained in Example 3-4 was used. The dispersion in acetone maintained uniform appearance, indicating very good dispersibility.

Example 3-13

A graphite oxide composite dispersion in methanol was prepared and allowed to stand for 24 hours as in Example 3-12 except that methanol was used as a dispersion medium. The dispersion in methanol maintained uniform appearance, indicating very good dispersibility. Further, the dispersion in methanol had better dispersibility than that in Example 3-11 in which an amphoteric surfactant was used as a single surfactant.

Example 3-14

A graphite oxide composite dispersion in acetone was prepared and allowed to stand for 24 hours as in Example 3-7 except that the graphite oxide composite-containing wet cake obtained in Example 3-5 was used. The dispersion in acetone maintained uniform appearance, indicating very good dispersibility.

Example 3-15

A graphite oxide composite dispersion in 1-hexanol was prepared and allowed to stand for 24 hours as in Example 3-14 except that 1-hexanol was used as a dispersion medium. The dispersion in 1-hexanol maintained uniform appearance, indicating very good dispersibility.

Example 3-16

A graphite oxide composite dispersion in acetone was prepared and allowed to stand for 24 hours as in Example 3-7 except that the graphite oxide composite-containing wet cake obtained in Example 3-6 was used. The dispersion in acetone maintained uniform appearance, indicating very good dispersibility.

Example 3-17

A graphite oxide composite dispersion in 1-hexanol was prepared and allowed to stand for 24 hours as in Example 3-16 except that 1-hexanol was used as a dispersion medium. The dispersion in 1-hexanol maintained uniform appearance, indicating very good dispersibility.

Example 3-18

A graphite oxide composite dispersion in ethyl acetate was prepared and allowed to stand for 24 hours as in Example 3-16 except that ethyl acetate was used as a dispersion medium. The dispersion in ethyl acetate maintained uniform appearance, indicating very good dispersibility.

Examples 3-19 to 3-28

An amount of 10 parts of the dispersion obtained in Example 3-8 was mixed with 90 parts of each of the following monomers: the liquid epoxy resin jER828US (Example 3-19), acid anhydride KAYAHARED MCD for curing epoxy resin available from Nippon Kayaku Co., Ltd. (Example 3-20), acrylic acid (Example 3-21), butyl acrylate (Example 3-22), 2-ethylhexyl acrylate (Example 3-23), methacrylic acid (Example 3-24), methyl methacrylate (Example 3-25), cyclohexyl methacrylate (Example 3-26), vinyl acetate (Example 3-27), and styrene (Example 3-28). Thus, dispersions each mainly containing the selected monomer as a dispersion medium were prepared. Each of the resulting dispersions had very good dispersibility, and no aggregates were produced. Further, the curability of the subsequent molded body was not affected.

This demonstrates that the carbon material composite of the present invention is well dispersed also in resin-based dispersion media without aggregation.

The results of Examples 3-1 to 3-6 and Comparative Examples 3-1 and 3-2 demonstrated that good purification efficiency was achieved by adding an amphoteric surfactant before purification. The results of Examples 3-7 to 3-28 demonstrated that the carbon material composites (graphite oxide composites) obtained by any of the above-described purification techniques were each well dispersed in various dispersion media. The method of producing a carbon material composite of the present invention can simply produce a high-quality carbon material composite at low cost. The carbon material composite of the present invention can be dispersed in various solvents by altering surfactants. Thus, carbon material composite dispersions in various solvents can be obtained.

The invention claimed is:
1. A method of producing a carbon material composite containing graphite oxide and at least one surfactant selected from the group consisting of a nonionic surfactant, a cationic surfactant, and an amphoteric surfactant, the method comprising:

oxidizing graphite using sulfuric acid;

mixing an aqueous dispersion obtained through the oxidizing, the aqueous dispersion containing graphite oxide dispersed therein, and the at least one surfactant selected from the group consisting of a nonionic surfactant, a cationic surfactant, and an amphoteric surfactant; and purifying the carbon material composite.

2. The method of producing a carbon material composite according to claim 1, wherein the purifying includes purifying the carbon material composite by at least one technique selected from the group consisting of filtration, decantation, centrifugation, and solvent extraction.

3. The method of producing a carbon material composite according to claim 1, wherein the mixing includes mixing the aqueous dispersion, the cationic surfactant, and the nonionic surfactant, or mixing the aqueous dispersion, the amphoteric surfactant, and the nonionic surfactant and/or the cationic surfactant.

4. The method of producing a carbon material composite according to claim 1, further comprising exfoliating into layers the graphite oxide in the carbon material composite purified in the purifying.

5. The method of producing a carbon material composite according to claim 1, wherein the aqueous dispersion contains sulfate ions in an amount of 1% by mass or more relative to 100% by mass of the aqueous dispersion.

* * * * *